(12) United States Patent
Strasser et al.

(10) Patent No.: US 8,315,092 B2
(45) Date of Patent: Nov. 20, 2012

(54) APPARATUS, SYSTEM, AND METHOD FOR DETERMINING A READ VOLTAGE THRESHOLD FOR SOLID-STATE STORAGE MEDIA

(75) Inventors: John Strasser, Syracuse, UT (US); David Flynn, Sandy, UT (US); Jeremy Fillingim, Salt Lake City, UT (US); Robert Wood, Nwot, CO (US)

(73) Assignee: Fusion-IO, Inc., Salt Lake City, UT (US)

( * ) Notice: Subject to any disclaimer, the term of this patent is extended or adjusted under 35 U.S.C. 154(b) by 164 days.

(21) Appl. No.: 13/015,458

(22) Filed: Jan. 27, 2011

(65) Prior Publication Data

US 2011/0182119 A1 Jul. 28, 2011

Related U.S. Application Data

(60) Provisional application No. 61/298,861, filed on Jan. 27, 2010, provisional application No. 61/305,205, filed on Feb. 17, 2010.

(51) Int. Cl.
*G11C 11/34* (2006.01)

(52) U.S. Cl. ......... 365/185.03; 365/185.09; 365/185.11; 365/185.12; 365/185.18; 365/185.2; 365/185.24; 365/185.29; 365/185.33

(58) Field of Classification Search ............. 365/185.03, 365/185.09, 185.11, 185.12, 185.18, 185.2, 365/185.24, 185.29, 185.33
See application file for complete search history.

(56) References Cited

U.S. PATENT DOCUMENTS

| | | | |
|---|---|---|---|
| 5,261,068 | A | 11/1993 | Gaskins et al. |
| 5,438,671 | A | 8/1995 | Miles |
| 5,701,434 | A | 12/1997 | Nakagawa |
| 5,845,329 | A | 12/1998 | Onishi et al. |
| 5,960,462 | A | 9/1999 | Solomon et al. |
| 6,000,019 | A | 12/1999 | Dykstal et al. |
| 6,170,039 | B1 | 1/2001 | Kishida |
| 6,170,047 | B1 | 1/2001 | Dye |
| 6,173,381 | B1 | 1/2001 | Dye |
| 6,185,654 | B1 | 2/2001 | Van Doren |
| 6,278,633 | B1 | 8/2001 | Wong et al. |

(Continued)

FOREIGN PATENT DOCUMENTS

KR   2009011712   11/2009

(Continued)

OTHER PUBLICATIONS

International Search Report and Written Opinion, PCT/US2011/022786, Sep. 29, 2011.

(Continued)

*Primary Examiner* — Trong Phan
(74) *Attorney, Agent, or Firm* — Kunzler Law Group, PC

(57) ABSTRACT

An apparatus, system, and method are disclosed for determining a read voltage threshold for solid-state storage media. A data set read module reads a data set from storage cells of solid-state storage media. The data set is originally stored in the storage cells with a known bias. A deviation module determines that a read bias for the data set deviates from the known bias. A direction module determines a direction of deviation for the data set. The direction of deviation is based on a difference between the read bias of the data set and the known bias. An adjustment module adjusts a read voltage threshold for the storage cells of the solid-state storage media based on the direction of deviation.

28 Claims, 11 Drawing Sheets

U.S. PATENT DOCUMENTS

| | | |
|---|---|---|
| 6,330,688 B1 | 12/2001 | Brown |
| 6,356,986 B1 | 3/2002 | Solomon et al. |
| 6,370,631 B1 | 4/2002 | Dye |
| 6,385,710 B1 | 5/2002 | Goldman et al. |
| 6,412,080 B1 | 6/2002 | Fleming et al. |
| 6,418,478 B1 | 7/2002 | Ignatius et al. |
| 6,523,102 B1 | 2/2003 | Dye et al. |
| 6,567,889 B1 | 5/2003 | DeKoning et al. |
| 6,587,915 B1 | 7/2003 | Kim |
| 6,601,211 B1 | 7/2003 | Norman |
| 6,625,685 B1 | 9/2003 | Cho et al. |
| 6,655,758 B2 * | 12/2003 | Pasotti et al. ............ 365/185.03 |
| 6,671,757 B1 | 12/2003 | Multer et al. |
| 6,683,810 B2 * | 1/2004 | Sakamoto ................ 365/185.03 |
| 6,754,774 B2 | 6/2004 | Gruner et al. |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,807,097 B2 * | 10/2004 | Takano et al. ............ 365/185.03 |
| 6,877,076 B1 | 4/2005 | Cho et al. |
| 6,880,049 B2 | 4/2005 | Gruner et al. |
| 6,883,079 B1 | 4/2005 | Priborsky |
| 6,938,133 B2 | 8/2005 | Johnson et al. |
| 6,975,542 B2 | 12/2005 | Roohparvar |
| 6,985,996 B1 | 1/2006 | Nagshain |
| 7,010,652 B2 | 3/2006 | Piccirillo et al. |
| 7,020,758 B2 | 3/2006 | Fisk |
| 7,043,599 B1 | 5/2006 | Ware et al. |
| 7,050,337 B2 | 5/2006 | Iwase et al. |
| 7,089,391 B2 | 8/2006 | Geiger et al. |
| 7,139,894 B1 | 11/2006 | Mensching et al. |
| 7,181,572 B2 | 2/2007 | Walmsley |
| 7,194,577 B2 | 3/2007 | Johnson et al. |
| 7,219,238 B2 | 5/2007 | Saito et al. |
| 7,243,203 B2 | 7/2007 | Scheuerlein |
| 7,274,600 B2 | 9/2007 | Roohparvar |
| 7,340,558 B2 | 3/2008 | Lee et al. |
| 7,466,575 B2 | 12/2008 | Shalvi et al. |
| 7,518,931 B2 | 4/2009 | Shim |
| 7,548,464 B2 * | 6/2009 | Kim ........................ 365/185.18 |
| 7,555,575 B2 | 6/2009 | Kaneda |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,751,240 B2 | 7/2010 | Shalvi |
| 7,752,463 B2 | 7/2010 | Hahn et al. |
| 7,773,413 B2 | 8/2010 | Shalvi |
| 7,818,525 B1 | 10/2010 | Frost et al. |
| 7,821,826 B2 | 10/2010 | Shalvi et al. |
| 7,856,541 B2 | 12/2010 | Kaneda et al. |
| 7,864,573 B2 | 1/2011 | Perlmutter et al. |
| 7,881,107 B2 | 2/2011 | Shalvi |
| 7,898,867 B2 * | 3/2011 | Hazama et al. .......... 365/185.18 |
| 7,900,102 B2 | 3/2011 | Sokolov et al. |
| 7,903,468 B2 * | 3/2011 | Litsyn et al. ............. 365/185.03 |
| 7,924,587 B2 | 4/2011 | Perlmutter et al. |
| 7,925,936 B1 | 4/2011 | Sommer |
| 7,970,919 B1 | 6/2011 | Duran |
| 7,978,541 B2 * | 7/2011 | Sutardja ................... 365/185.03 |
| 8,135,936 B2 | 3/2012 | Schaefer et al. |
| 8,224,782 B2 | 7/2012 | Murase |
| 2002/0069317 A1 | 6/2002 | Chow et al. |
| 2002/0069318 A1 | 6/2002 | Chow et al. |
| 2003/0198084 A1 | 10/2003 | Fujisawa et al. |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0193166 A1 | 9/2005 | Johnson et al. |
| 2005/0246510 A1 | 11/2005 | Retnamma et al. |
| 2006/0004955 A1 | 1/2006 | Ware et al. |
| 2006/0028875 A1 | 2/2006 | Avraham |
| 2007/0016699 A1 | 1/2007 | Minami |
| 2007/0104004 A1 | 5/2007 | So et al. |
| 2007/0132452 A1 | 6/2007 | Alsop |
| 2007/0132453 A1 | 6/2007 | Ogino |
| 2007/0132456 A1 | 6/2007 | Salman et al. |
| 2007/0132457 A1 | 6/2007 | Okamoto et al. |
| 2007/0132458 A1 | 6/2007 | Allen, Jr. |
| 2007/0198770 A1 | 8/2007 | Horii et al. |
| 2008/0026203 A1 | 1/2008 | Gates et al. |
| 2008/0053472 A1 | 3/2008 | Hadden |
| 2008/0053473 A1 | 3/2008 | Lee |
| 2008/0068747 A1 | 3/2008 | Sasaki et al. |
| 2008/0111058 A1 | 5/2008 | Feldman et al. |
| 2008/0126686 A1 | 5/2008 | Sokolov et al. |
| 2008/0130341 A1 | 6/2008 | Shalvi et al. |
| 2008/0139441 A1 | 6/2008 | Xiao et al. |
| 2008/0148115 A1 | 6/2008 | Sokolov et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0263262 A1 | 10/2008 | Sokolov et al. |
| 2008/0282106 A1 | 11/2008 | Shalvi et al. |
| 2009/0024905 A1 | 1/2009 | Shalvi et al. |
| 2009/0037691 A1 | 2/2009 | Master et al. |
| 2009/0043951 A1 | 2/2009 | Shalvi et al. |
| 2009/0050703 A1 | 2/2009 | Lifson et al. |
| 2009/0052252 A1 | 2/2009 | Kang et al. |
| 2009/0063450 A1 | 3/2009 | Petri |
| 2009/0091979 A1 | 4/2009 | Shalvi |
| 2009/0103358 A1 | 4/2009 | Sommer et al. |
| 2009/0103365 A1 | 4/2009 | Roohparvar |
| 2009/0106485 A1 | 4/2009 | Anholt |
| 2009/0138652 A1 | 5/2009 | Kim et al. |
| 2009/0144600 A1 | 6/2009 | Perlmutter et al. |
| 2009/0147581 A1 | 6/2009 | Isobe |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0251969 A1 | 10/2009 | Roohparvar et al. |
| 2009/0296486 A1 | 12/2009 | Kim et al. |
| 2010/0074016 A1 | 3/2010 | Higashitani |
| 2010/0091535 A1 | 4/2010 | Sommer et al. |
| 2010/0110787 A1 | 5/2010 | Shalvi et al. |
| 2010/0115376 A1 | 5/2010 | Shalvi et al. |
| 2010/0124088 A1 | 5/2010 | Shalvi et al. |
| 2010/0131826 A1 | 5/2010 | Shalvi et al. |
| 2010/0131827 A1 | 5/2010 | Sokolov et al. |
| 2010/0157641 A1 | 6/2010 | Shalvi et al. |
| 2010/0157675 A1 | 6/2010 | Shalvi et al. |
| 2010/0165689 A1 | 7/2010 | Rotbard et al. |
| 2010/0165730 A1 | 7/2010 | Sommer et al. |
| 2010/0195390 A1 | 8/2010 | Shalvi |
| 2010/0199150 A1 | 8/2010 | Shalvi et al. |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2010/0332955 A1 | 12/2010 | Anholt |

FOREIGN PATENT DOCUMENTS

| | | |
|---|---|---|
| WO | 2007132452 | 11/2007 |
| WO | 2007132453 | 11/2007 |
| WO | 2008026203 | 3/2008 |
| WO | 2009037691 | 3/2009 |
| WO | 2009051960 | 4/2009 |
| WO | 2009053963 | 4/2009 |
| WO | 2009072102 | 6/2009 |
| WO | 2009072104 | 6/2009 |

OTHER PUBLICATIONS

Chung Chiu-Chiao, A multilevel read and verifying scheme for Bi-NAND flash memories, May 2007.

CTAN010:SLC vs. MLC NAND, Cactus Technologies, Jun. 3, 2008.

Application No. PCT/US2011022786, International Preliminary Report on Patentability, Aug. 9, 2012.

U.S. Appl. No. 13/189,402, Office Action, Sep. 12, 2012.

\* cited by examiner

APPARATUS, SYSTEM, AND METHOD FOR DETERMINING A READ VOLTAGE THRESHOLD FOR SOLID-STATE STORAGE MEDIA

CROSS-REFERENCE TO RELATED APPLICATIONS

This application claims priority to U.S. Provisional Patent Application No. 61/298,861 entitled "APPARATUS, SYSTEM, AND METHOD FOR DETERMINING A READ VOLTAGE THRESHOLD FOR SOLID-STATE STORAGE MEDIA" and filed on Jan. 27, 2010 for John Strasser, et al. and to U.S. Provisional Patent Application No. 61/305,205 entitled "APPARATUS, SYSTEM, AND METHOD FOR DETERMINING A READ VOLTAGE THRESHOLD FOR SOLID-STATE STORAGE MEDIA" and filed on Feb. 17, 2010 for John Strasser, et al., both of which are incorporated herein by reference.

BACKGROUND

1. Field

The subject matter disclosed herein relates to solid-state storage media and more particularly relates to read voltage thresholds for solid-state storage media.

2. Description of the Related Art

Many solid-state storage devices distinguish between different binary values that a storage cell may store based on a read voltage level of the storage cell. Solid-state storage devices may use one or more read voltage thresholds to separate discrete values that may be stored in a storage cell.

The read voltage levels of a storage cell, however, can shift over time. For example, storage cell damage, storage cell leakage, and other disturbances to storage cells can alter the read voltage levels of the storage cells. The rate of leakage and other disturbances can also increase with age as storage cells are used over time. If the read voltage level of a storage cell shifts past a read voltage threshold, a data error occurs, as the value of the data read from the storage cell is different than the value of the data written to the storage cell.

BRIEF SUMMARY

From the foregoing discussion, it should be apparent that a need exists for an apparatus, system, and method that determine a direction of deviation for a read voltage threshold of solid-state storage media. Beneficially, such an apparatus, system, and method would adjust a read voltage threshold for solid-state storage media to compensate for shifts in read voltage levels over time.

The present invention has been developed in response to the present state of the art, and in particular, in response to the problems and needs in the art that have not yet been fully solved by currently available solid-state storage devices. Accordingly, the present invention has been developed to provide an apparatus, system, and method for adjusting read voltage thresholds for solid-state storage media that overcome many or all of the above-discussed shortcomings in the art.

A method of the present invention is presented for determining a direction to adjust a read voltage threshold for solid-state storage media. In one embodiment, the method includes reading a data set from storage cells of solid-state storage media. The data set, in certain embodiments, is originally stored in the storage cells with a known bias. The method, in a further embodiment, includes determining that a read bias for the data set deviates from the known bias. In another embodiment, the method includes determining a direction of deviation for the data set based on a difference between the read bias and the known bias.

In one embodiment, the method includes adjusting a read voltage threshold for the storage cells of the solid-state storage media based on the direction of deviation. The read voltage threshold, in certain embodiments, is adjusted in the direction of deviation.

In one embodiment, adjusting the read voltage threshold for the storage cells is based at least partially on one or more statistics for a solid-state storage device of the solid-state storage media. The one or more statistics, in various embodiments, may include a temperature for the solid-state storage device, an error rate for the solid-state storage device, an erase cycle count for the solid-state storage device, a storage request latency for the solid-state storage device, or the like.

In one embodiment, the known bias includes an expected bias for data stored by the solid-state storage media based on a reversible biasing algorithm applied to data written to the solid-state storage media. In another embodiment, the known bias includes an error corrected state of bits of the data set and the read bias includes an error bias indicating one or more bits of the data set that are in error.

In one embodiment, the method includes receiving the known bias and the error bias for the data set from an error correction code ("ECC") decoder. The ECC decoder, in certain embodiment, changes the one or more bits that are in error to the error corrected state. In a further embodiment, determining that the read bias for the data set deviates from the known bias is performed in response to detecting an uncorrectable data error in the data set. In another embodiment, determining the direction of deviation is performed in response to detecting an uncorrectable data error in the data set.

In one embodiment, the known bias includes a known ratio of binary ones and binary zeroes. The known ratio, in one embodiment, is greater than zero and less than one so that the direction of deviation in either direction of the known ratio is detectable. Stated differently, in certain embodiments, the known ratio is offset between a ratio of exclusively binary ones and a ratio of exclusively binary zeroes so that the direction of deviation may occur in either direction from the known ratio.

In one embodiment, the data set includes a sample data set read in response to a testing operation. In a further embodiment, the data set includes a requested data set read in response to a read request from a client. The data set, in certain embodiments, includes a requested data set and further includes an amount of additional data read from the solid-state storage media with the requested data set. The amount of additional data, in one embodiment, is sized to fit within excess read bandwidth of the solid-state storage media so that reading the amount of additional data does not affect a read bandwidth for retrieving the requested data set from the solid-state storage media.

In one embodiment, the method includes determining that the data set was read from a specific grouping of storage cells based on a position of the data set within a sequence of data sets. The solid-state storage media, in certain embodiments, includes a plurality of groupings of storage cells and data from each grouping of storage cells is read during a read operation. Each grouping of storage cells, in one embodiment, includes a solid-state storage media die. Data from each grouping of storage cells, in a further embodiment, is read in parallel during a read operation.

In one embodiment, the storage cells include multi-level storage cells. The data set, in certain embodiments, includes a subset of binary data that the multi-level storage cells store. The subset of binary data, in one embodiment, is read from a lower page of the multi-level storage cells. In a further embodiment, each multi-level storage cell has a plurality of states encoded according to an encoding model so that each state represents two or more bits of the multi-level storage cell having one of two different binary values.

In one embodiment, determining a direction of deviation for the data set includes determining that the direction of deviation is toward a larger read voltage in response to the difference between the read bias and the known bias indicating that one or more storage cell values have transitioned from a binary one to a binary zero. In another embodiment, determining a direction of deviation for the data set includes determining that the direction of deviation is toward a smaller read voltage in response to the difference between the read bias and the known bias indicating that one or more storage cell values have transitioned from a binary zero to a binary one.

An apparatus to determine a read voltage threshold for solid-state storage media is provided with a plurality of modules configured to functionally execute the necessary steps of adjusting a read voltage threshold for solid-state storage cells. These modules in the described embodiments include a data set read module, a deviation module, a direction module, an adjustment module, an ECC decoder, an inverse bias module, and a device factor module.

In one embodiment, the data set read module reads a data set from storage cells of solid-state storage media. The data set, in certain embodiments, is originally stored in the storage cells with a known bias. The deviation module, in one embodiment, determines that a read bias for the data set deviates from the known bias. In another embodiment, the direction module determines a direction of deviation for the data set. The direction of deviation, in a further embodiment, comprises a difference between the read bias and the known bias. The adjustment module, in one embodiment, adjusts a read voltage threshold for the storage cells of the solid-state storage media based on the direction of deviation.

In one embodiment, the ECC decoder provides the known bias and the read bias to the deviation module. The known bias, in a further embodiment, includes an error corrected state of bits of the data set. The read bias, in another embodiment, includes an error bias indicating one or more bits of the data set that are in error.

In one embodiment, the inverse bias module provides the known bias and the read bias to the deviation module. The known bias, in certain embodiments, includes an expected bias for data stored by the solid-state storage media based on a reversible biasing algorithm applied to data written to the solid-state storage media.

In one embodiment, the device factor module provides, to the adjustment module, one or more statistics for a solid-state storage device of the solid-state storage media. The adjustment module, in a further embodiment, adjusts the read voltage threshold for the storage cells of the solid-state storage media at least partially based on the one or more statistics for the solid-state storage device.

A system of the present invention is also presented to determine a direction to adjust a read voltage threshold for solid-state storage media. The system may be embodied by a solid-state storage device including solid-state storage media and a storage controller for the solid-state storage device. The storage controller for the solid-state storage device, in certain embodiments, includes a data set read module, a deviation module, a direction module, and an adjustment module.

In one embodiment, the data set read module reads a data set from storage cells of the solid-state storage media. The data set, in certain embodiments, is originally stored in the storage cells with a known bias. The deviation module, in a further embodiment, determines that a read bias for the data set deviates from the known bias. In one embodiment, the direction module determines a direction of deviation for the data set. The direction of deviation, in another embodiment, comprises a difference between the read bias and the known bias. In one embodiment, the adjustment module adjusts a read voltage threshold for the storage cells of the solid-state storage media based on the direction of deviation.

In one embodiment, the deviation module uses an error bias as the known bias in response to the one or more correctable errors in the data set. The deviation module, in another embodiment, uses an expected bias as the known bias in response to one or more uncorrectable errors in the data set. An error bias, in one embodiment, indicates one or more bits of the data set that are in error. The expected bias, in a further embodiment, is based on a reversible biasing algorithm applied to data written to the solid-state storage media.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the invention will be readily understood, a more particular description of the invention will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
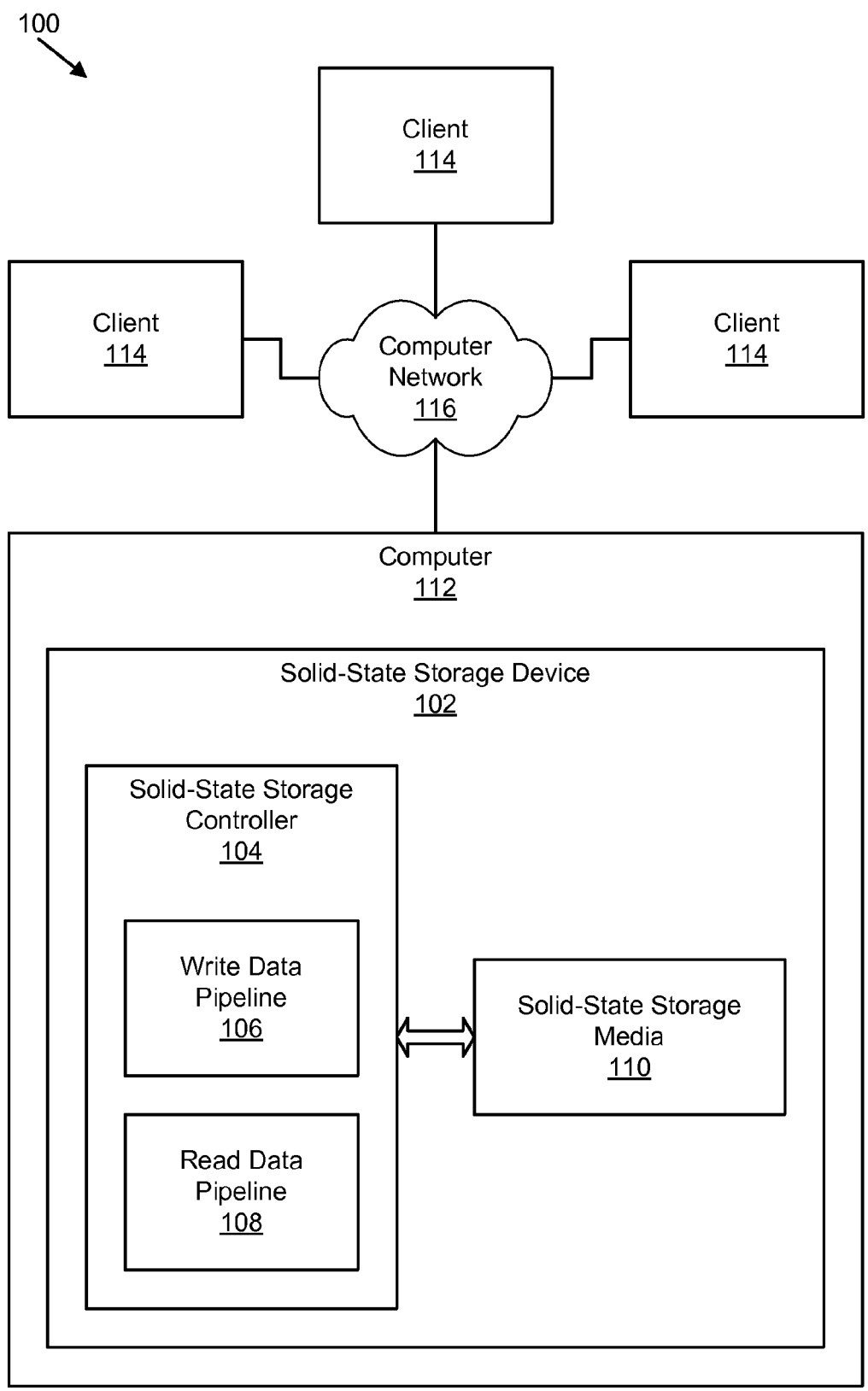
FIG. 1 is a schematic block diagram illustrating one embodiment of a system for determining a read voltage threshold for solid-state storage media in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus memory device. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System

FIG. 1 is a schematic block diagram illustrating one embodiment of a system 100 for determining a read voltage threshold for solid-state storage media 110 in accordance with the present invention. The system 100 includes a solid-state storage device 102, a solid-state storage controller 104, a write data pipeline 106, a read data pipeline 108, a solid-state storage media 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage media 110, such as flash memory, nano random access memory ("nano RAM or NRAM"), magneto-resistive RAM ("MRAM"), dynamic RAM ("DRAM"), phase change RAM ("PRAM"), racetrack memory, memristor memory, nanocrystal wire-based memory, silicon-oxide based sub-10 nanometer process memory, graphene memory, silicon-oxide-nitride-oxide-silicon ("SONOS") memory, resistive random-access memory ("RRAM"), programmable metallization cell ("PMC"), conductive-bridging RAM ("CBRAM"), or the like. The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system communications bus, such as a peripheral component interconnect express ("PCI-e") bus, a Serial Advanced Technology Attachment ("serial ATA") bus, or the like. In another embodiment, the solid-state storage device 102 is external to the computer 112 and is connected using an external communications bus, such as a universal serial bus ("USB") connection, an Institute of Electrical and Electronics Engineers ("IEEE") 1394 bus ("FireWire"), or the like. In other embodiments, the solid-state storage device 102 is connected to the computer 112 using a communications bus such as a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid-state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage media 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112. The solid-state storage controller 104, in certain embodiments, receives source data for storage in the solid-state storage media 110 from a processor of the computer 112 and/or from a client 114 over one or more communications buses as described above.

Solid-State Storage Device

Figure 2:
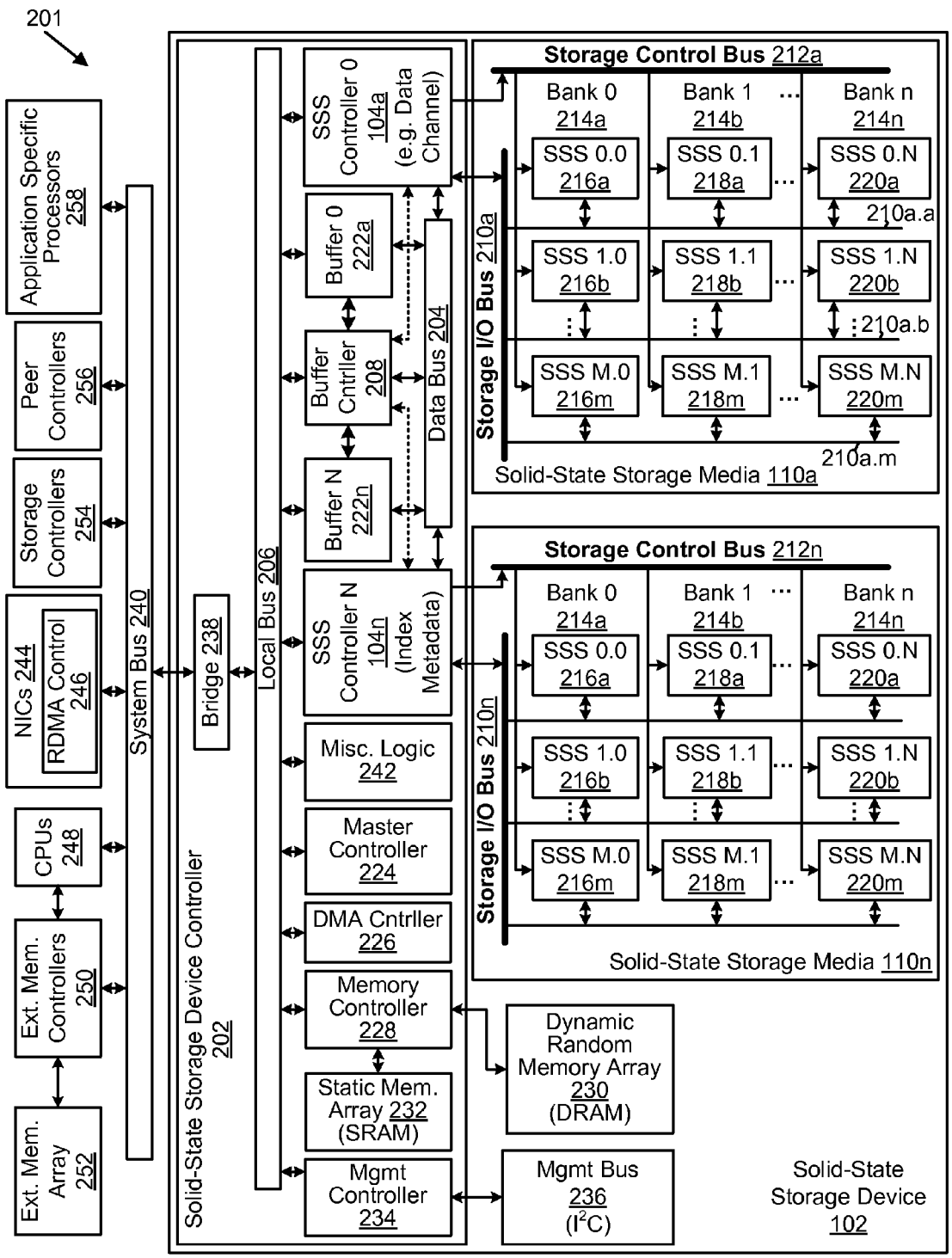
FIG. 2 is a schematic block diagram illustrating one embodiment of a solid-state storage device controller for solid-state storage media in accordance with the present invention.

FIG. 2 is a schematic block diagram illustrating one embodiment 201 of a solid-state storage device controller 202 that includes a write data pipeline 106 and a read data pipeline 108 in a solid-state storage device 102 in accordance with the present invention. The solid-state storage device controller 202 may be embodied as hardware, as software, or as a combination of hardware and software. The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index meta-data channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid-state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3A. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a column of solid-state storage elements 216, 218, 220 is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage media 110. In one embodiment, a solid-state storage media 110a includes twenty solid-state storage elements per bank (e.g. 216a-m in bank 214a, 218 a-m in bank 214b, 220a-m in bank 214n, where m=22) with eight banks (e.g. 214a-n where n=8) and a solid-state storage media 110n includes two solid-state storage elements (e.g. 216a-m where m=2) per bank 214 with one bank 214a. There is no requirement that two solid-state storage media 110a, 110n have the same number of solid-state storage elements and/or same number of banks 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210a row (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216a-220a, each in a separate bank 214a-n. In another embodiment, 20 storage elements (e.g. SSS 0.0-SSS 20.0) 216 form a virtual bank 214a so that each of the eight virtual banks has 20 storage elements (e.g. SSS0.0-SSS 20.8). Data is sent to the solid-state storage media 110 over the storage I/O bus 210 to all storage elements of a particular group of storage elements (SSS 0.0-SSS 0.8) 216a, 218a, 220a. The storage control bus 212a is used to select a particular bank (e.g. Bank-0 214a) so that the data received over the storage I/O bus 210 connected to all banks 214 is written just to the selected bank 214a.

In certain embodiments, the storage control bus 212 and storage I/O bus 210 are used together by the solid-state controller 104 to communicate addressing information, storage element command information, and data to be stored. Those of skill in the art recognize that this address, data, and command information may be communicated using one or the other of these buses 212, 210, or using separate buses for each type of control information. In one embodiment, addressing information, storage element command information, and storage data travel on the storage I/O bus 210 and the storage control bus 212 carries signals for activating a bank as well as identifying whether the data on the storage I/O bus 210 lines constitute addressing information, storage element command information, or storage data.

For example, a control signal on the storage control bus 212 such as "command enable" may indicate that the data on the storage I/O bus 210 lines is a storage element command such as program, erase, reset, read, and the like. A control signal on the storage control bus 212 such as "address enable" may indicate that the data on the storage I/O bus 210 lines is addressing information such as erase block identifier, page identifier, and optionally offset within the page within a particular storage element. Finally, an absence of a control signal on the storage control bus 212 for both "command enable" and "address enable" may indicate that the data on the storage I/O bus 210 lines is storage data that is to be stored on the storage element at a previously addressed erase block, physical page, and optionally offset within the page of a particular storage element.

In one embodiment, the storage I/O bus 210 is comprised of one or more independent I/O buses ("IIOBa-m" comprising 210a.a-m, 210n.a-m) wherein the solid-state storage elements within each row share one of the independent I/O buses across each solid-state storage element 216, 218, 220 in parallel so that all banks 214 are accessed simultaneously. For example, one HOB 210a.a of the storage I/O bus 210 may access a first solid-state storage element 216a, 218a, 220a of each bank 214a-n simultaneously. A second HOB 210a.b of the storage I/O bus 210 may access a second solid-state storage element 216b, 218b, 220b of each bank 214a-n simultaneously. Each row of solid-state storage elements 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220 using either of the chip select signal and the chip enable signal. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element has a page size of 4 kB. A single bank 214a of 20 solid-state storage elements 216a-m would then have an 80 kB capacity of pages accessed with the same address going out of the storage I/O bus 210.

This group of pages in a bank 214 of solid-state storage elements 216, 218, 220 of 80 kB may be called a logical or virtual page. Similarly, an erase block of each storage element 216a-m of a bank 214a may be grouped to form a logical erase block. In one embodiment, erasing a logical erase block causes a physical erase block of each storage element 216a-m of a bank 214a to be erased. In one embodiment, an erase block of pages within a solid-state storage element 216, 218, 220 is erased when an erase command is received within a solid-state storage element 216, 218, 220. In another embodiment, a single physical erase block on each storage element (e.g. SSS M.N) collectively forms a logical erase block for the solid-state storage media 110a. In such an embodiment, erasing a logical erase block comprises erasing an erase block at the same address within each storage element (e.g. SSS M.N) in the solid-state storage media 110a. Whereas the size and number of erase blocks, pages, planes, or other logical and physical divisions within a solid-state storage element 216, 218, 220 may change over time with advancements in technology, it is to be expected that many embodiments consistent with new configurations are possible and are consistent with the general description herein.

In one embodiment, data is written in packets to the storage elements. The solid-state controller 104 uses the storage I/O bus 210 and storage control bus 212 to address a particular bank 214, storage element 216, 218, 220, physical erase block, physical page, and optionally offset within a physical page for writing the data packet. In one embodiment, the solid-state controller 104 sends the address information for the data packet by way of the storage I/O bus 210 and signals that the data on the storage I/O bus 210 is address data by way of particular signals set on the storage control bus 212. The solid-state controller 104 follows the transmission of the address information with transmission of the data packet of data that is to be stored. The physical address contains enough information for the solid-state storage element 216, 218, 220 to direct the data packet to the designated location within the page.

In one embodiment, the storage I/O bus 210a.a connects to each storage element in a row of storage elements (e.g. SSS 0.0-SSS 0.N 216a, 218a, 220a). In such an embodiment, the solid-state controller 104a activates a desired bank 214a using the storage control bus 212a, such that data on storage I/O bus 210a.a reaches the proper page of a single storage element (e.g. SSS 0.0 216a).

In addition, in certain embodiments, the solid-state controller 104a simultaneously activates the same bank 214a using the storage control bus 212a, such that different data (a different data packet) on storage I/O bus 210a.b reaches the proper page of a single storage element on another row (e.g. SSS 1.0 216b). In this manner, multiple physical pages of multiple storage elements 216, 218, 220 may be written to simultaneously within a single bank 214 to store a logical page.

Similarly, a read command may require a command on the storage control bus 212 to select a single bank 214a and the appropriate page within that bank 214a. In one embodiment, a read command reads an entire physical page from each storage element, and because there are multiple solid-state storage elements 216, 218, 220 in parallel in a bank 214, an entire logical page is read with a read command. However, the read command may be broken into subcommands, as will be explained below with respect to bank interleave. A logical page may also be accessed in a write operation.

In one embodiment, a solid-state controller 104 may send an erase block erase command over all the lines of the storage I/O bus 210 to erase a physical erase block having a particular erase block address. In addition, the solid-state controller 104 may simultaneously activate a single bank 214 using the storage control bus 212 such that each physical erase block in the single activated bank 214 is erased as part of a logical erase block.

In another embodiment, the solid-state controller 104 may send an erase block erase command over all the lines of the storage I/O bus 210 to erase a physical erase block having a particular erase block address on each storage element 216, 218, 220 (SSS 0.0-SSS M.N). These particular physical erase blocks together may form a logical erase block. Once the address of the physical erase blocks is provided to the storage elements 216, 218, 220, the solid-state controller 104 may initiate the erase command on a bank 214a by bank 214b by bank 214n basis (either in order or based on some other sequence). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, the storage controller 104 sequentially writes data on the solid-state storage media 110 in a log structured format and within one or more physical structures of the storage elements, the data is sequentially stored on the solid-state storage media 110. Sequentially writing data involves the storage controller 104 streaming data packets into storage write buffers for storage elements, such as a chip (a package of one or more dies) or a die on a circuit board. When the storage write buffers are full, the data packets are programmed to a designated virtual or logical page ("LP"). Data packets then refill the storage write buffers and, when full, the data packets are written to the next LP. The next virtual page may be in the same bank 214a or another bank (e.g. 214b). This process continues, LP after LP, typically until a virtual or logical erase block ("LEB") is filled. LPs and LEBs are described in more detail below.

In another embodiment, the streaming may continue across LEB boundaries with the process continuing, LEB after LEB. Typically, the storage controller 104 sequentially stores data packets in an LEB by order of processing. In one embodiment, where a write data pipeline 106 is used, the storage controller 104 stores packets in the order that they come out of the write data pipeline 106. This order may be a result of data segments arriving from a requesting device mixed with packets of valid data that are being read from another storage location as valid data is being recovered from another LEB during a recovery operation.

The sequentially stored data, in one embodiment, can serve as a log to reconstruct data indexes and other metadata using information from data packet headers. For example, in one embodiment, the storage controller 104 may reconstruct a storage index by reading headers to determine the data structure to which each packet belongs and sequence information to determine where in the data structure the data or metadata belongs. The storage controller 104, in one embodiment, uses physical address information for each packet and timestamp or sequence information to create a mapping between the physical locations of the packets and the data structure identifier and data segment sequence. Timestamp or sequence information is used by the storage controller 104 to replay the sequence of changes made to the index and thereby reestablish the most recent state.

In one embodiment, erase blocks are time stamped or given a sequence number as packets are written and the timestamp or sequence information of an erase block is used along with information gathered from container headers and packet headers to reconstruct the storage index. In another embodiment, timestamp or sequence information is written to an erase block when the erase block is recovered.

In a read, modify, write operation, data packets associated with the logical structure are located and read in a read operation. Data segments of the modified structure that have been modified are not written to the location from which they are read. Instead, the modified data segments are again converted to data packets and then written to the next available location in the virtual page currently being written. Index entries for the respective data packets are modified to point to the packets that contain the modified data segments. The entry or entries in the index for data packets associated with the same logical structure that have not been modified will include pointers to original location of the unmodified data packets. Thus, if the original logical structure is maintained, for example to maintain a previous version of the logical structure, the original logical structure will have pointers in the index to all data packets as originally written. The new logical structure will have pointers in the index to some of the original data packets and pointers to the modified data packets in the virtual page that is currently being written.

In a copy operation, the index includes an entry for the original logical structure mapped to a number of packets stored on the solid-state storage media 110. When a copy is made, a new logical structure is created and a new entry is created in the index mapping the new logical structure to the original packets. The new logical structure is also written to the solid-state storage media 110 with its location mapped to the new entry in the index. The new logical structure packets may be used to identify the packets within the original logical structure that are referenced in case changes have been made in the original logical structure that have not been propagated to the copy and the index is lost or corrupted. In another embodiment, the index includes a logical entry for a logical block.

Beneficially, sequentially writing packets facilitates a more even use of the solid-state storage media 110 and allows the solid-storage device controller 202 to monitor storage hot spots and level usage of the various virtual pages in the solid-state storage media 110. Sequentially writing packets also facilitates a powerful, efficient garbage collection system, which is described in detail below. One of skill in the art will recognize other benefits of sequential storage of data packets.

The system 100 may comprise a log-structured storage system or log-structured array similar to a log-structured file system and the order that data is stored may be used to recreate an index. Typically an index that includes a logical-to-physical mapping is stored in volatile memory. If the index is corrupted or lost, the index may be reconstructed by addressing the solid-state storage media 110 in the order that the data was written. Within a logical erase block ("LEB"), data is typically stored sequentially by filling a first logical page, then a second logical page, etc. until the LEB is filled. The solid-state storage controller 104 then chooses another LEB and the process repeats. By maintaining an order that the LEBs were written to and by knowing that each LEB is written sequentially, the index can be rebuilt by traversing the solid-state storage media 110 in order from beginning to end. In other embodiments, if part of the index is stored in non-volatile memory, such as on the solid-state storage media 110, the solid-state storage controller 104 may only need to replay a portion of the solid-state storage media 110 to rebuild a portion of the index that was not stored in non-volatile memory. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

In one embodiment, the solid-state storage controller(s) 104 communicate data to the solid-state storage media 110 over a storage I/O bus 210. In a certain embodiment where the solid-state storage is arranged in banks 214 and each bank 214 includes multiple storage elements 216, 218, 220 accessible in parallel, the storage I/O bus 210 comprises an array of busses, one for each row of storage elements 216, 218, 220 spanning the banks 214. As used herein, the term "storage I/O bus" may refer to one storage I/O bus 210 or an array of data independent busses 204. In one embodiment, each storage I/O bus 210 accessing a row of storage elements (e.g. 216a, 218a, 220a) may include a logical-to-physical mapping for storage divisions (e.g. erase blocks) accessed in a row of storage elements 216a, 218a, 220a. This mapping allows a logical address mapped to a physical address of a storage division to be remapped to a different storage division if the first storage division fails, partially fails, is inaccessible, or has some other problem. Remapping is explained further in relation to the remapping module 430 of FIG. 4.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device 155 can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting requests, directs creation of indexes to map identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. The master controller 224 may be embodied as hardware, as software, or as a combination of hardware and software. One skilled in the art will recognize many embodiments for the master controller 224.

In one embodiment, where the storage controller 152/ solid-state storage device controller 202 manages multiple data storage devices/solid-state storage media 110a-n, the master controller 224 divides the work load among internal controllers, such as the solid-state storage controllers 104a-n. For example, the master controller 224 may divide a data structure to be written to the data storage devices (e.g. solid-state storage media 110a-n) so that a portion of the data structure is stored on each of the attached data storage devices. This feature is a performance enhancement allowing quicker storage and access to a data structure. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224 emulates block storage such that a computer 112 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks. The master controller 224 then maps the blocks and physical address sent with the block to the actual locations determined by the master controller 224. The mapping is stored in the index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/ solid-state storage devices 102, the master controller 224 may be a RAID controller for single tier RAID, multi-tier RAID, progressive RAID, etc. The master controller 224 may also allows some objects and other data structures to be stored in a RAID array and other data structures to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/ solid-state storage device 102 may autonomously manage objects or other data structures and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the logical-to-physical index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I²C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3A:
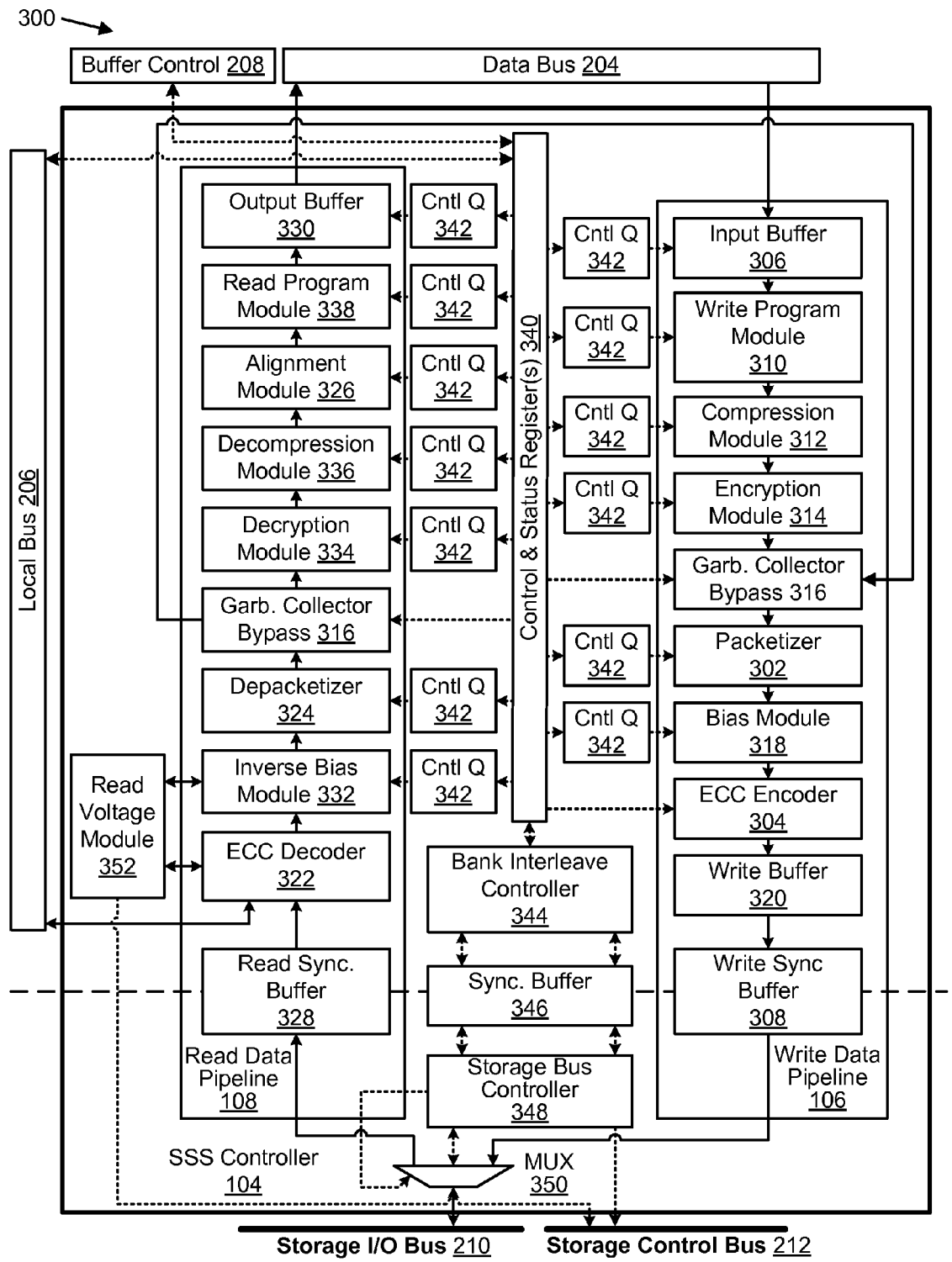
FIG. 3A is a schematic block diagram illustrating one embodiment of a solid-state storage controller with a write data pipeline and a read data pipeline for solid-state storage media in accordance with the present invention.

FIG. 3A is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") encoder 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a bias module 318, and a write buffer 320. The read data pipeline 108 includes a read synchronization buffer 328, an ECC decoder 322, a depacketizer 324, an alignment module 326, and an output buffer 330. In other embodiments, the read data pipeline 108 may include a read voltage module 352, an inverse bias module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of an object, but may also include an entire object. In another embodiment, the data segment is part of a block of data, but may also include an entire block of data. Typically, a set of data such as an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object or data block.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC encoder 304 that that generates one or more error-correcting codes ("ECC") for the one or more packets received from the packetizer 302. The ECC encoder 304 typically uses an error correcting algorithm to generate ECC check bits which are stored with the one or more data packets. The ECC codes generated by the ECC encoder 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC encoder 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC encoder 304 and corresponding ECC decoder 322 onboard the solid-state storage device 102, the solid-state storage device 102 can internally correct errors and has a longer useful life than if a less robust ECC algorithm is used, such as single bit correction. However, in other embodiments the ECC encoder 304 may use a less robust algorithm and may correct single-bit or double-bit errors. In another embodiment, the solid-state storage media 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC encoder 304 prior to writing the packets to the solid-state storage media 110. The write synch buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a bias module 318 that receives the one or more packets from the packetizer 302, either directly or indirectly. The bias module 318 biases the bits of the data packets toward a bias of storage cells of the solid-state storage media 110. As used herein, a "bias" is a preference, probability, tendency, or desirability of values for bits within a set of bits to exhibit a specific data pattern. A bias may be a natural property, a designed attribute, a property of performing an operation on storage media, or a random occurrence. Data itself may have a bias and data storage media may have a bias. A bias may be toward binary ones, toward binary zeroes, toward a balance of binary ones and zeroes, toward a certain binary value for certain bits, or the like.

For example, in one embodiment, end sections of data files may be padded with binary zeroes, causing the data packets that store the end sections to exhibit a bias toward binary zeroes, meaning that the data packets have more binary zeroes than binary ones. Other data packets may have more binary ones than zeroes, or a balance of binary ones and zeroes. While data packets may each have an individual bias based on data within the packets, a bias of the storage cells of the solid-state storage media 110 may be based on some benefit associated with the storage of a particular binary value or pattern, or some property of the storage cells. One example of a storage cell property, NAND flash storage cells presently are biased to all binary one values or almost all binary one values when provided by a manufacturer. In addition, performing an erase operation on the NAND flash storage cells sets the binary values in each storage cell to a binary one, such that programming of the storage cells comprises changing certain storage cells to a binary zero value. This bias to all binary one values or almost all binary one values when provided by a manufacturer or when erased represents one example of an empty state for storage cells of a non-volatile solid-state storage media.

Each of the storage elements 216, 218, 220, in one embodiment, store binary data in a plurality of storage cells that exhibit a bias. Each storage cell stores one or more binary bits, or values. Flash memory storage cells may be single-level cells ("SLC") that each store a single binary bit, or multi-level cells ("MLC") that each store two or more binary bits. Examples of storage cells include transistors, capacitors, magnetic elements, mechanical elements, optical elements, and the like. In flash memory, each storage cell is typically a floating-gate transistor. NRAM, MRAM, DRAM, PRAM, and other types of solid-state storage may have other types of storage cells, and may store either a single binary bit or two or more binary bits per storage cell.

In one embodiment, the storage cells in the storage elements 216, 218, 220 in an empty or erased state store initial binary values. The initial binary values represent a bias for the storage cells. For example, the storage cells may have a physical, electrical, mechanical, or other quality that causes them to store a certain value by default. In another embodiment, the bias may be intentionally selected based on design considerations of the solid-state storage media 110, on security considerations, on compatibility issues, or the like, and may not be based on a default property of the storage cells.

For example, in one embodiment, the storage cells of the storage elements 216, 218, 220 may each store a binary value of one upon delivery from a manufacturer, and may each be erased to a value of one prior to being programmed, or written to, as is typical with flash memory. In another embodiment, the storage cells of the storage elements 216, 218, 220 may be biased toward binary zeroes, toward a balance or equal amount of binary ones and zeroes, toward a certain binary value for a plurality of bits, toward a binary pattern, or the like.

In certain embodiments, a bias of one or more storage cells may be influenced by or based on a state of other storage cells physically adjacent to or otherwise in proximity to the one or more storage cells. For example, it may be desirable to bias data stored in storage cells to minimize inter-cell interference between the storage cells and other storage cells, or the like. Inter-cell interference can be caused by voltage differentials between physically adjacent storage cells and, in certain embodiments, biasing data to reduce or minimize the voltage differentials between storage cells based on a physical geometry of the storage cells can reduce inter-cell interference. In one embodiment, storage cells of the solid-state storage media 110 may have a bias toward a binary pattern that satisfies a predefined voltage differential threshold between the storage cells and other physically adjacent storage cells, or the like.

In addition to local types of inter-cell interference, larger multi-cell structures, such as bit strings, word lines, or the like, may experience inter-cell interference. Certain stripes or other patterns in data, such as stripes of binary ones or of binary zeroes, may interfere with the accuracy or effectiveness of sense amplifiers and/or other management circuitry for these larger, multi-cell structures, and it may be advantageous to bias data away from such stripes or other patterns.

For certain types of storage cells, such as SLC flash memory, the voltage level of a storage cell and associated voltage differentials between storage cells may be based on a single bit value for each storage cell and biasing data may include biasing toward a binary pattern with minimal transitions between binary one values and binary zero values within a data packet and/or within a physical region of storage cells. For other types of storage cells, such as MLC flash memory, the voltage level of a storage cell and associated voltage differentials between storage cells may be based on groups of bits forming a sub-pattern or symbol, and biasing data may include biasing toward a binary pattern with minimal transitions between certain sub-patterns or symbols. One example of using sub-patterns or symbols includes binary or Gray-code mapping of multiple binary values to associated charge levels within MLC storage cells. The bits stored by a single MLC storage cell, in certain embodiments, may not have adjacent addresses, but may be stored on different physical pages, logical pages, or the like.

In one embodiment, the bias module 318 biases source data to reduce inter-cell interference as a separate step performed separately from, instead of, or in addition to other biasing techniques. For example, upon flipping, whitening, compressing, relocating, and/or otherwise biasing source data, separate blocks of source data may still exhibit patterns that cause inter-cell interference, and the bias module 318 may bias one or more of the separate blocks of source data toward a pattern that minimizes inter-cell interference, or the like.

The bias module 318 biases a packet by changing a bias of the packet to more closely match a bias of the storage cells of the solid-state storage media 110. The bias module 318 biases the packets in a reversible manner, such that the inverse bias module 332 can convert the packets back to their original source data values with their original source biases. In one embodiment, the packets that the bias module 318 biases are sized for storage in a specific logical or physical storage region or division of the solid-state storage media 110, such as an erase block, a virtual erase block, a page, a virtual page, an ECC chunk, a division within a page, or the like. In one embodiment, the bias module 318 selectively biases certain packets based on a bias of the packets, and may not bias other packets. The bias module 318 is described in greater detail below with regard to FIG. 5A.

Those of skill in the art recognize that the bias module 318 may, alternatively, operate on one or more data segments that form a subset of a data packet. Similarly, the inverse bias module 332 may operate on data segments as well. Alternatively, or in addition, in one embodiment, the data packet (or data packet subsets such as a data segment) may be sized based on a size of a storage region in the solid-state storage media 110, a size of a bus or buffer, a size of a pipeline 106, 108, a number of extra bits available for storage of an indicator, or the like.

By biasing data packets toward the bias of the storage cells, the bias module 318 increases performance and endurance of the solid-state storage media 110 and the solid-state storage device 102. For example, biasing packets to more closely match the bias of the storage cells decreases write times and erase times because fewer actual storage cells must be changed to execute the operation. It also increases the writable life of the storage cells because fewer operations that are executed on a storage cell mean that the storage cell will last longer before wear begins to affect the storage cell performance/reliability. In certain embodiments, biasing data packets may decrease power consumption or have other additional benefits. Because, in one embodiment, the storage cells store initial binary values that satisfy a bias just prior to being programmed or written to, the closer that the data packets match the bias of the storage cells, the fewer the number of storage cells that are changed to store the data packets, and the more storage cells that remain in a biased state.

As depicted, the bias module 318 biases the one or more packets prior to sending the packets to the ECC encoder 304. Depending on the method that the bias module 318 uses to bias the packets, and on other design considerations, in a further embodiment, the bias module 318 may receive data subsequent to the ECC encoder 304 in the write data pipeline 106, or be placed elsewhere in the write data pipeline 106. For example, in certain embodiments, it may be beneficial to keep ECC data separate from data that the bias module 318 biases, while in other embodiments it may be beneficial for the bias module 318 to bias data that includes ECC data from the ECC encoder 304.

In one embodiment, the bias module 318 biases one or more data segments prior to sending the data segments to the ECC encoder 304. The data segment may be a grouping of bits smaller than a data packet in one embodiment. In such an embodiment, the data segment may comprise the width in bits/bytes of the write data pipeline 106. Similarly, the inverse bias module 332 may convert biased data segments back to their original source state after they are read. Biasing and inverse biasing a data segment may facilitate use of the bias module 318 and the inverse bias module 332 in a write data pipeline 106 and a read data pipeline 108 because the data segment may be sized to match the size (bus width) of data streaming through the pipelines 106,108.

In another embodiment, the bias module 318 may be integrated with another element of the write data pipeline 106, such as the compression module 312, the encryption module 314, the ECC encoder 304, or the like. The bias module 318 and corresponding inverse bias module 332 transparently increase the performance of the solid-state storage media 110 as the bias module 318 biases data packets before they are written and the inverse bias module 332 converts the biased data packets back to their original source state after they are read.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an object basis and received in conjunction with receiving data segments as described below. For example, an encryption key for a data segment to be encrypted by the encryption module 314 may be received with the data segment or may be received as part of a command to write an object to which the data segment belongs. The solid-sate storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102, if the solid-state storage media 110 is connected to a different solid-state storage controller 104, solid-state storage device 102, or computer 112, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by clients 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the Solid-State Storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC decoder 322 that determines if a data error exists in ECC blocks a requested packet received from the solid-state storage media 110 by using ECC stored with each ECC block of the requested packet. The ECC decoder 322 then corrects any errors in the requested packet if any error exists and the errors are correctable using the ECC. For example, if the ECC can detect an error in six bits but can only correct three bit errors, the ECC decoder 322 corrects ECC blocks of the requested packet with up to three bits in error. The ECC decoder 322 corrects the bits in error by changing the bits in error to the correct one or zero state so that the requested data packet is identical to when it was written to the solid-state storage media 110 and the ECC was generated for the packet.

In certain embodiments, the ECC decoder 322 may provide error information for correctable errors to the read voltage module 352, described below, such as locations of the bits in error, values for the bits in error, and/or other error information. For example, the ECC decoder 322 may provide an error bias to the read voltage module 352, indicating one or more bits of a data set that are in error, or the like. An error bias, as used herein, is a representation of one or more detected bit errors in a data set. In one embodiment, an error bias includes a location or position of a detected bit error in a data set. In another embodiment, an error bias includes a value for a detected bit error. A value for a detected error may include an error corrected value of a bit in error, an error value of the bit in error, or the like. For example, in one embodiment, the ECC decoder 322 may provide the read voltage module 352 with an uncorrected data set and an error bias indicating locations of detected bit errors and the read voltage module 352 may determine a known bias by inverting or flipping the bits in those locations. In another embodiment, for example, the ECC decoder 322 may provide the read voltage module 352 with an error corrected data set and an error bias indicating locations of detected bit errors and the read voltage module 352 may determine a read bias by inverting or flipping the bits in those locations.

If the ECC decoder 322 determines that the requested packets contains more bits in error than the ECC can correct, the ECC decoder 322 cannot correct the errors in the corrupted ECC blocks of the requested packet and sends an interrupt. In one embodiment, the ECC decoder 322 sends an interrupt with a message indicating that the requested packet is in error. The message may include information that the ECC decoder 322 cannot correct the errors or the inability of the ECC decoder 322 to correct the errors may be implied. In another embodiment, the ECC decoder 322 sends the corrupted ECC blocks of the requested packet with the interrupt and/or the message.

In one embodiment, a corrupted ECC block or portion of a corrupted ECC block of the requested packet that cannot be corrected by the ECC decoder 322 is read by the master controller 224, corrected, and returned to the ECC decoder 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the object to which the packet belongs. In another embodiment, the solid-state storage controller 104 stores data using some type of RAID and is able to recover the corrupted data. In another embodiment, the ECC decoder 322 sends an interrupt and/or message and the receiving device fails the read operation associated with the requested data packet. One of skill in the art will recognize other options and actions to be taken as a result of the ECC decoder 322 determining that one or more ECC blocks of the requested packet are corrupted and that the ECC decoder 322 cannot correct the errors.

The read data pipeline 108 includes a depacketizer 324 that receives ECC blocks of the requested packet from the ECC decoder 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the object index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the solid-state storage controller 104 includes a read voltage module 352 that adjusts read voltage thresholds for the solid-state storage media 110. In a further embodiment, the read voltage module 352 may be integrated with the solid-state storage media 110 such that it operates independently from the read data pipeline 108. In one embodiment, the read voltage module 352 receives a data set from the solid-state storage media 110, either directly or indirectly. In certain embodiments, the read voltage module 352 may receive one or more requested biased packets from the ECC decoder 322. In a further embodiment, the read voltage module 352 may receive a data set from the read synchronization buffer 328, directly from the storage I/O bus 210, from the inverse bias module 332, or otherwise. The read voltage module 352 is described in greater detail with regard to FIG. 4. Another embodiment, where the read voltage module 352 receives input from both the ECC decoder 322 and the inverse bias module 332 is described below with regard to FIG. 3B.

In general, the read voltage module 352 adjusts one or more read voltage thresholds for one or more storage cells from the solid-state storage media 110. A read voltage threshold is a voltage level that separates discrete values stored in the storage cells of the solid-state storage media 110. For SLC storage cells that store a single binary value, the read voltage threshold is the boundary between a binary one state and a binary zero state. For example, in one embodiment, a storage cell with a read voltage level above the read voltage threshold stores a binary one while a storage cell with a read voltage level below the read voltage threshold stores a binary zero. Other types of storage cells, such as MLC storage cells, may have multiple read voltage thresholds, to distinguish between more than two discrete states.

For example, in one embodiment, MLC storage cells that store two bits may have three read voltage thresholds, separating binary values of 11, 01, 00, and 10. The three example read voltage thresholds may be x volts, y volts, and z volts, described in greater detail below with regard to the read voltage thresholds 662 of FIG. 6C. If the voltage read from a storage cell falls between Vmin and x volts, a binary 11 state is indicated. In certain embodiments, Vmin may be a negative voltage. If the voltage read from a storage cell falls between x volts and y volts, a binary 01 state is indicated. If the voltage read from a storage cell falls between y volts and z volts, a binary 00 state is indicated. If the voltage read from a storage cell falls between z volts and Vmax volts, a binary 10 state is indicated.

The voltages for Vmin, Vmax, x, y, z may vary based on the manufacturer of the storage cells. Read voltages, for example, may range between −3.5 and 5.8 volts, or between another predefined range of voltages. Similarly, the order of binary state changes 11, 01, 00, and 10 relative to read voltage thresholds may vary based on the encoding type used, such as a Gray code encoding type, a binary code encoding type, or the like. One example encoding type is described below with regard to FIG. 6C. As described in greater detail with regard to FIG. 6C, although a single MLC storage cell stores multiple bits, bits from a single storage cell may not have adjacent addresses, and may be included in different physical pages, logical pages, or the like.

In certain embodiments, instead of referring to a boundary between discrete values, a read voltage threshold comprises a range of voltages (a maximum and a minimum) that indicate a value. A voltage threshold that is a range can be adjusted by changing the boundary at either end, or at both ends, of the range. The read voltage thresholds for the solid-state storage media 110, in one embodiment, are initially set at a default level that may be defined by a manufacturer.

The read voltage levels of storage cells can shift over time, however, due to leakage and other disturbances of the solid-state storage media 110. The rate of leakage can also increase with the wear and age of the solid-state storage media 110. If the read voltage level of a storage cell shifts past the read voltage threshold, a data error occurs, as the value of the data read from the storage cell is different than the value of the data written to the storage cell. The read voltage module 352, in one embodiment, adjusts a read voltage threshold for one or more storage cells from the solid-state storage media 110 to compensate for shifts in the read voltage levels of the storage cells. By dynamically adjusting read voltage thresholds, the read voltage module 352 can increase the retention rate for and/or the reliability of data stored in the solid-state storage media 110 and extend the useable lifetime of the solid-state storage media 110 itself.

The read voltage module 352, in one embodiment, uses a known bias of the data set or packet from the solid-state storage media 110 to adjust the read voltage threshold. As described above with regard to the bias module 318, a bias is a preference, probability, tendency, or desirability of values for bits within a set of bits to exhibit a specific data pattern. A bias may be a natural property, a designed attribute, a property of performing an operation on storage media, or a random occurrence. A bias may be toward binary ones, toward binary zeroes, toward a balance of binary ones and zeroes, toward a certain binary value for certain bits, toward a specific ratio of binary ones and binary zeroes, toward a binary pattern, or the like.

In one embodiment, the data set or packet that the read voltage module 352 receives has a known bias. The data set or packet has a known bias for one of at least three reasons. First, the data set or packet may have a known bias because the bias module 318 biased the data set or packet when the data set or packet was written. In one embodiment, the bias module 318 and/or the inverse bias module 332 cooperate with the read voltage module 352, communicating the known bias to the read voltage module 352. The bias module 318 is discussed in greater detail with regard to FIG. 5A. Second, the data set or packet may have a known bias because the data set or packet is read from a virgin, unwritten region of the solid-state storage media 110. For example, in one embodiment, virgin, unwritten regions of the solid-state storage media 110 may typically have a known bias of exclusively binary ones or exclusively binary zeroes in an unwritten state. Third, the data set or packet may have a known bias because the ECC decoder 322 has corrected the data set or packet and has determined the original, correct values of one or more bits of the data set that were in error. The correct values for the bits in the data set comprise this known bias. A deviation from the known bias caused by errors in the data set is an error bias.

The read voltage module 352, in one embodiment, determines that a read bias for the data set or packet deviates from the known bias, and determines a direction of deviation for the data set based on a difference between the read bias and the known bias. In a further embodiment, the read voltage module 352 adjusts the read voltage threshold for storage cells corresponding to the data set based on the direction of deviation. For example, in one embodiment, the read voltage module 352 may lower the read voltage threshold from the previous read voltage threshold to a new read voltage threshold for the storage cells if the data set has more binary zeroes than expected based on the known bias. For MLC storage cells, in one embodiment, a data set may include data from different addresses, different pages, or the like so that the data set includes all data that the associated storage cells store. The read voltage module 352 may base a read voltage threshold adjustment on known characteristics of the storage cells, such as an encoding type used for the storage cells, based on a physical and/or electrical architecture of the storage cells, or the like. In a further embodiment, the read voltage module 352 may transform, translate, or combine data from different addresses or pages to facilitate a determination of a known bias, a read bias, and/or a deviation from a known bias for MLC storage cells. In another embodiment, for MLC storage cells, the read voltage module 352 may adjust a read voltage threshold for the MLC storage cells based on a subset of the data stored by the MLC storage cells.

The read voltage module 352, in one embodiment, may request that the data set be re-read with the new read voltage threshold. The read voltage module 352 may determine whether the re-read data set has a read bias that deviates from the known bias, and may iteratively adjust the read voltage threshold to a new read voltage threshold until the read bias of the data set no longer deviates from the known bias more than a threshold amount (which may be zero), until the ECC decoder 322 can correct errors in the data set, or the like. In one embodiment, the read voltage module 352 stores the new read voltage threshold such that the new read voltage threshold is persistent for subsequent data reads from the solid-state storage media 110. In a further embodiment, the solid-state storage media 110 stores the new read voltage threshold for subsequent data reads.

The read voltage module 352, in one embodiment, may monitor the read bias of each packet read and compare the bias of the packet or other data set to the known bias in response to a read request. In a further embodiment, the read voltage module 352 may monitor the read bias of each packet read and may compare the bias of the data set or packet to the known bias in response to a data error, such as, for example, an uncorrectable bit error that the ECC decoder 322 cannot correct, or the like. In a further embodiment, the read voltage module 352 may not monitor the read bias of each packet read and may determine and compare the bias of the data set or packet to the known bias exclusively in response to a data error.

In one embodiment, the solid-state storage controller 104 may read data in a data packet from multiple channels, storage elements, dies, chips, physical erase blocks ("PEBs"), groupings of storage cells, or the like within the solid-state storage media 110, each of which may have independent read voltage thresholds. The manufacturer of the channels, storage elements, dies, chips, and/or grouping of storage cells may make the read voltage thresholds for each channel, storage element, die, chip, and/or grouping of storage cells independently adjustable by the solid-state storage controller 104. Alternatively, or in addition, the manufacturer of the channels, storage elements, dies, chips, and/or grouping of storage cells may make the read voltage thresholds for groups of channels, groups of storage elements, groups of die, groups of chips, and/or groups of groupings of storage cells adjustable by the solid-state storage controller 104 as separate groups.

In one embodiment, the ECC encoder 304 creates independent ECC checkbits for each channel, storage element, die, chip, PEB, or other grouping of storage cells. The ECC checkbits are stored with the data on a particular grouping of storage cells rather than being distributed across multiple groupings. If ECC checkbits are created and stored independently for each grouping of storage cells, the read voltage module 352, in response to a data error, may use the ECC checkbits and the known architecture for how an ECC checkbits are written to the groupings of storage cells to determine in which grouping of storage cells the data error occurred, and adjust the read voltage thresholds of those groupings. If ECC checkbits for the data packet are stored across multiple groupings of storage cells, the read voltage module 352 may separately check the read biases of data sets from each grouping of storage cells and adjust one or more of the corresponding read voltage thresholds. An array of storage elements with multiple channels is described in greater detail with regard to FIGS. 6A and 6B.

In one embodiment, the read data pipeline 108 includes an inverse bias module 332 that receives one or more requested biased packets from the ECC decoder 322, either directly or indirectly, and converts the one or more requested packets back to their original source form by reversing the biasing process of the bias module 318 prior to sending the one or more requested packets to the depacketizer 324. In one embodiment, the inverse bias module 332 may use one or more indicators stored by the bias module 318 to convert the biased packets back to their original source data. In certain embodiments, the inverse bias module 332 may provide a known bias, a read bias, and/or a deviation from a known bias for a packet or other data set to the read voltage module 352, as described below with regard to FIG. 3B.

In a further embodiment, the inverse bias module 332 converts the biased packets back to their original source data without using an indicator. Instead of using an indicator, the inverse bias module 332 may implement an algorithm that is the inverse operation of the bias module 318. This algorithm may inverse the bias for each data packet received and/or a select number of data packets received. In the depicted embodiment, the inverse bias module 332 is located between the ECC decoder 322 and the depacketizer 324. In a further embodiment, the inverse bias module 332 may be located elsewhere in the read data pipeline 108, based on the location of the bias module 318 in the write data pipeline 106. The inverse bias module 332 is described in greater detail with regard to FIG. 5B.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3A, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC encoder 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342. The solid-state storage controller 104 and or solid-state storage device 102 may also include a bank interleave controller 344, a synchronization buffer 346, a storage bus controller 348, and a multiplexer ("MUX") 350.

Read Voltage Threshold

Figure 3B:
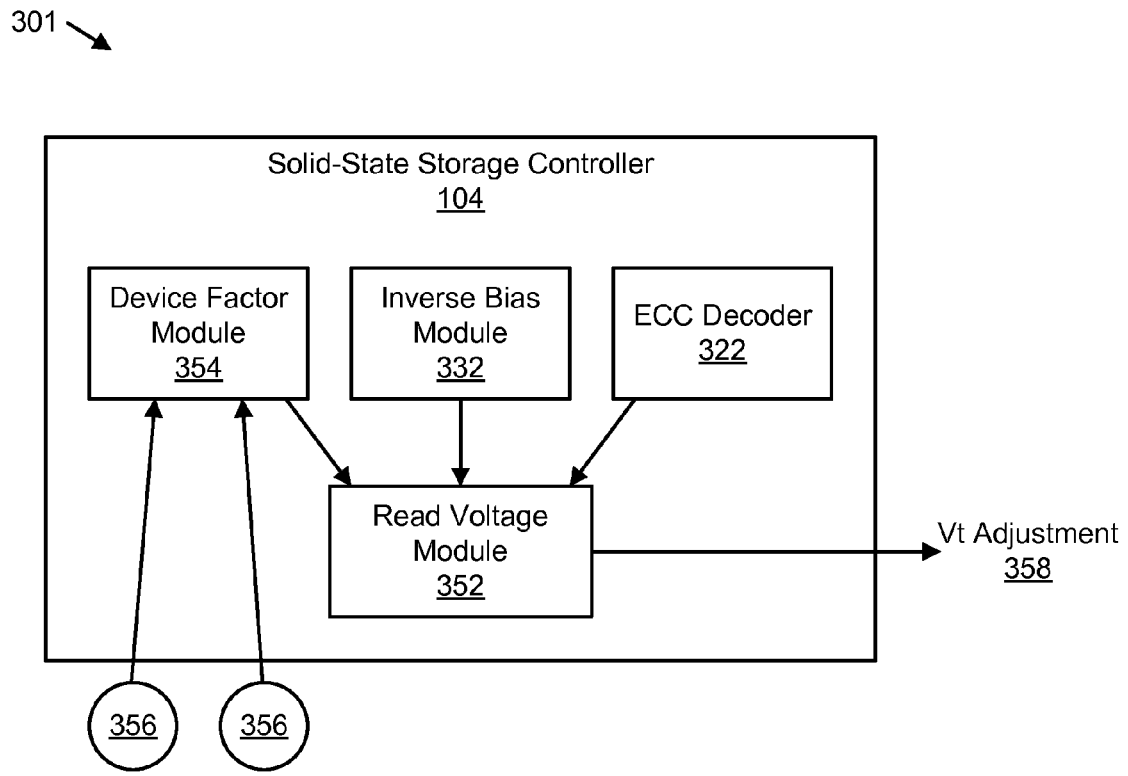
FIG. 3B is a schematic block diagram illustrating another embodiment of a solid-state storage controller in accordance with the present invention.

FIG. 3B is a schematic block diagram illustrating another embodiment 301 of a solid-state storage controller 104. In the depicted embodiment 301, the solid-state storage controller 104 includes a device factor module 354, the inverse bias module 332, the ECC decoder 322, and the read voltage module 352. Although not depicted in FIG. 3B, the solid-state storage controller 104 of the embodiment illustrated in FIG. 3B may also, in certain embodiments, include one or more additional modules or other elements from the solid-state storage controller 104 depicted in FIG. 3A, as described above.

In the depicted embodiment 301, the read voltage module 352 receives inputs from the inverse bias module 332, the ECC decoder 322, and the device factor module 354 and the read voltage module 352 determines a read voltage threshold adjustment 358 based on the inputs. In other embodiments, the read voltage module 352 may receive inputs from just the inverse bias module 332, from just the ECC decoder 322, from just the device factor module 354, or from a different combination of the inverse bias module 332, the ECC decoder 322, and/or the device factor module 354.

The inverse bias module 332, in one embodiment, provides a known bias and/or an actual read bias of a data set to the read voltage module 352. The inverse bias module 332 may provide the known bias as an expected bias based on a reversible biasing algorithm that the bias module 318 applies to data written to the solid-state storage media 110. The expected bias, in certain embodiments, may be an exact bias, where the bias module 318 uses a reversible biasing algorithm that biases data to exactly match a bias. For example, the bias module 318 may add padding data to a data set so that the data set has an exact balance of binary ones and binary zeroes, or the like, and the known bias may be exact.

In another embodiment, the inverse bias module 332 may provide the expected bias as a range, a distribution, an average, an estimate, or the like based on the reversible biasing algorithm that the bias module 318 applies to data. For example, the inverse bias module 332 may measure or learn an expected bias over time as the inverse bias module 332 applies an inverse biasing algorithm to data read from the solid-state storage media 110. In one embodiment, the expected bias may be mathematically or otherwise derived from the reversible biasing algorithm of the bias module 318 as a range or distribution of possible or likely biases.

For example, where the bias module 318 biases data toward a balance of one half binary ones and one half binary zeroes, which may also be referred to as a direct current ("DC") balance, a range of actual biases for biased data may range between about forty-six percent binary ones and fifty-four percent binary ones, or the like. The known bias and the read bias of the data set, in other embodiments, may also be based on multi-bit symbols or patterns of bits instead of being based exclusively on individual binary ones and zeroes, or the like. While the inverse bias module 332, in the depicted embodiment 301, provides input to the read voltage module 352, in certain embodiments, the bias module 318 may provide an expected bias to the read voltage module 352 as a known bias, the known bias may be hard coded or programmed into the read voltage module 352, or the like.

In one embodiment, the inverse bias module 332 provides a read bias of a data set read from the solid-state storage media 110 to the read voltage module 352. For example, as the inverse bias module 332 converts biased data packets or other data sets back to their original source form by reversing the biasing process of the bias module 318, the inverse bias module 332 may determine, measure, or detect the read bias of the data packets or other data sets. The inverse bias module 332 may determine a read bias prior to, during, or after reversing the biasing process, depending on the biasing process used. In certain embodiments, if the inverse bias module 332 determines that a read bias of a data set deviates from the known/expected bias of the data set, the inverse bias module 332 may provide the data set to the read voltage module 352 to make a read voltage threshold adjustment 358 to storage cells of the data set so that the data set may be re-read. In other embodiments, as described above with regard to FIG. 3A, the read voltage module 352 may adjust a read voltage threshold for a data set before the inverse bias module 332 receives the data set. One of skill in the art, in light of this specification, will recognize other arrangements of the read voltage module 352, the inverse bias module 332, and the ECC decoder 322, each of which fall within the scope of the present invention.

The ECC decoder 322, in one embodiment, provides a known bias and/or a read bias for a data set to the read voltage module 352. The ECC decoder 322 may provide a known bias for a data set having a correct state of bits for the data set. For example, once the ECC decoder 322 has corrected one or more correctable bit errors in a data set, the ECC decoder 322 may provide the error corrected state of the bits of the data set to the read voltage module 352 as a known bias with which the data set was written to the solid-state storage media 110. The ECC decoder 322, in a further embodiment, may provide the read bias for a data set as an error bias that indicates one or more bits of a data set that were in error when the data set was read from the solid-state storage media 110.

Because the ECC decoder 322, for correctable errors, determines the exact, original, correct values of bits (known bias) of a data set and an exact location of bits in error (error bias) of the data set the read voltage module 352 can determine an exact deviation of the data set from the known bias. For this reason, in certain embodiments, the read voltage module 352 may make more precise read voltage threshold adjustments 358 using a known bias and an error bias from the ECC decoder 322, when available, than using an expected bias and a read bias from the inverse bias module 332.

The read voltage module 352, in one embodiment, uses a known bias and/or an error bias for a data set from the ECC decoder 322 in response to one or more correctable bit errors in the data set. In a further embodiment, the read voltage module 352 uses an expected bias that is based on a reversible biasing algorithm as a known bias. In certain embodiments, the expected bias is used as the known bias in response to one or more uncorrectable bit errors in the data set. An error bias from the ECC decoder 322 may not be available to the read voltage module 352 for uncorrectable bit errors because the uncorrectable bit error condition makes the bias undefined. For uncorrectable bit errors in a data set, in certain embodiments, the read bias of the data set may deviate from the known, expected bias for the data set more than for correctable bit errors, because of the greater severity of the errors. Due to the greater magnitude of deviation of the read bias of a data set from the known, expected bias of the data set for uncorrectable bit errors, the bias information from the inverse bias module 332 may provide a better indicator of a direction for a read voltage threshold adjustment 358 for uncorrectable bit errors than for correctable bit errors.

The device factor module 354, in one embodiment, provides one or more statistics for the solid-state storage device 102 to the read voltage module 352. The read voltage module 352, in certain embodiments, may make a read voltage threshold adjustment 358 based on the one or more statistics, may supplement information from the inverse bias module 332 and/or the ECC decoder 322 with the one or more statistics, or the like. The one or more statistics for the solid-state storage device 102, in one embodiment, include statistics that may affect read voltages of storage cells of the solid-state storage device 102. For example, in certain embodiments, the one or more statistics may include a temperature for the solid-state storage device 102, an error rate for the solid-state storage device 102 (such as an uncorrectable bit error rate "UBER" or the like), an erase cycle count for the solid-state storage device 102, a storage request latency for the solid-state storage device 102 (such as an average, maximum, or other storage request execution latency), an age of the solid-state storage device 102, and/or other statistics or characteristics.

In the depicted embodiment 301, the device factor module 354 receives input from one or more sensors 356. The one or more sensors 356 each detect a statistic or characteristic for the solid-state storage device 102, such as temperature, moisture, movement, and/or other statistics. For example, in various embodiments, the one or more sensors 356 may include a temperature sensor, a moisture sensor, an accelerometer, and/or another type of sensor for the solid-state storage device 102. In one embodiment, the device factor module 354 and/or the read voltage module 352 may receive one or more statistics for the solid-state storage device 102 from one or more other modules or elements. For example, the device factor module 354 and/or the read voltage module 352 may receive an error rate for the solid-state storage device 102, such as a UBER or the like, from the ECC decoder 322.

The read voltage module 352, in various embodiments, may base a read voltage threshold adjustment 358 on a single input or on a combination of inputs from the inverse bias module 332, the ECC decoder 322, and/or the device factor module 354. In certain embodiments, one or more inputs from the inverse bias module 332, the ECC decoder 322, and/or the device factor module 354 may not be available for a data set. For example, the ECC decoder 322 may not provide an error bias and a known bias for a data set with an uncorrectable bit error, the inverse bias module 332 may not provide a known, expected bias or a read bias for a data set during a learning period while the inverse bias module 332 is determining an expected bias, the device factor module 354 may not provide one or more statistics during an initial startup period, or the like.

In one embodiment, the read voltage module 352 bases a read voltage threshold adjustment 358 on a best available input according to a predefined hierarchy or ranking of inputs. For example, the read voltage module 352 may base a read voltage threshold adjustment 358 on a known bias and error bias from the ECC decoder 322 if available; on a known, expected bias and a read bias from the inverse bias module 332 if input from the ECC decoder 322 is not available; and on one or more statistics from the device factor module 354 if input from both the ECC decoder 322 and the inverse bias module 332 is unavailable.

In a further embodiment, the read voltage module 352 may make a random read voltage threshold adjustment 358, in response to a data error or the like, if input from each of the inverse bias module 332, the ECC decoder 322, and the device factor module 354 is unavailable. For example, the read voltage module 352 may try a read voltage threshold adjustment 358 in one direction, re-read the data set and check for errors, and try a read voltage threshold adjustment 358 in the other direction if the error persists.

In another embodiment, the read voltage module 352 may base a read voltage threshold adjustment 358 on multiple inputs by combining the inputs from the inverse bias module 332, the ECC decoder 322, and/or the device factor module 354. The read voltage module 352 may scale the inputs, weight the inputs, convert the inputs to common units, or the like to facilitate combination of the inputs. For example, the read voltage module 352, in one embodiment, may convert each of the inputs to individual preliminary threshold adjustments, and then sum the preliminary threshold adjustments to provide a read voltage threshold adjustment 358. The read voltage module 352, in the example, may weight each preliminary threshold adjustment based on a predefined hierarchy or ranking of the associated inputs. For example, if a known bias and an error bias from the ECC decoder 322 indicates a read voltage threshold adjustment 358 in one direction and the known, expected bias and the read bias from the inverse bias module 332 indicates a read voltage threshold adjustment 358 in the other direction, the input with greater weight or priority in the predefined hierarchy or ranking will dictate the direction of the read voltage threshold adjustment 358.

Figure 4:
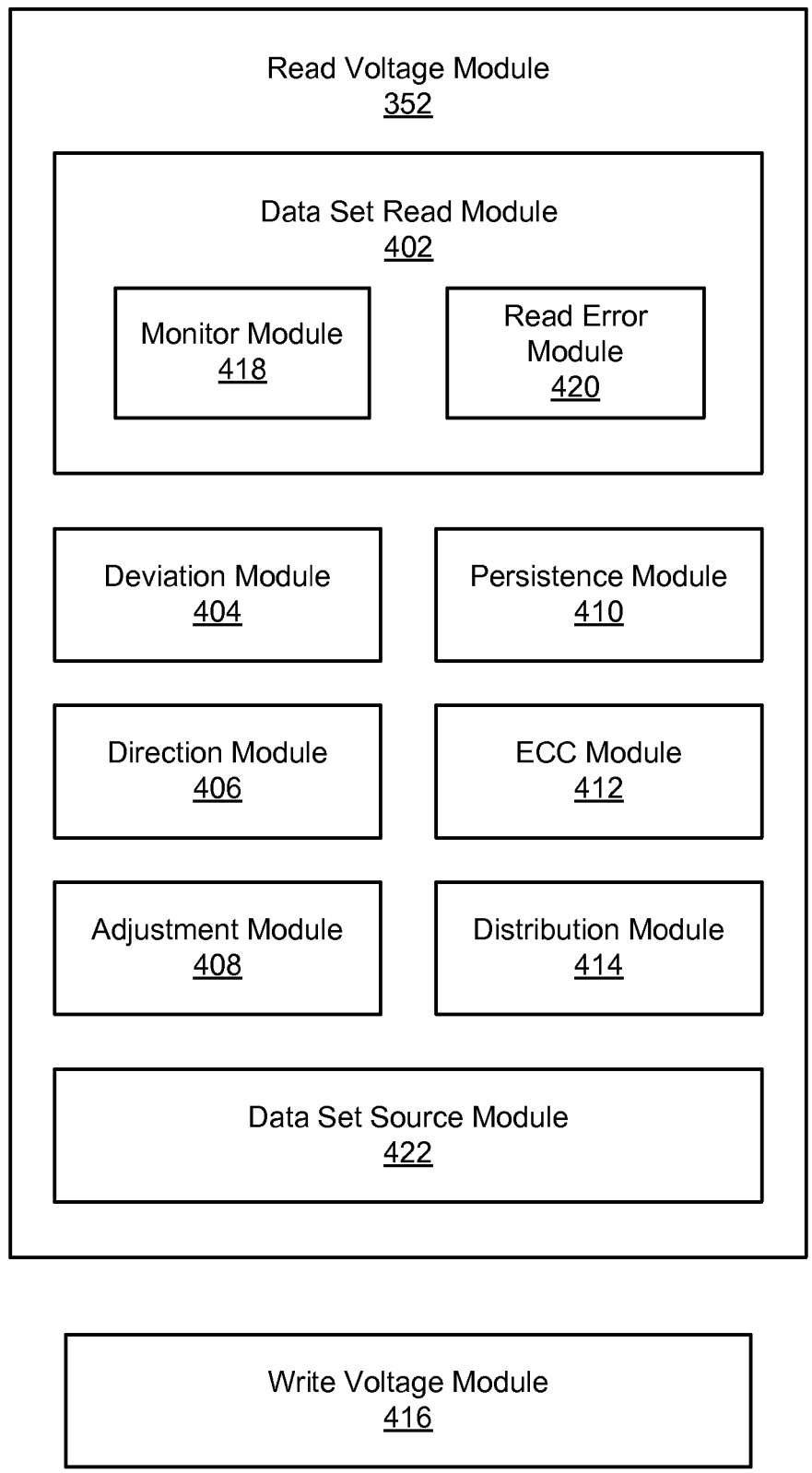
FIG. 4 is a schematic block diagram illustrating one embodiment of a read voltage module in accordance with the present invention.

FIG. 4 is a schematic block diagram illustrating one embodiment of a read voltage module 352. In the depicted embodiment, the read voltage module 352 includes a data set read module 402, a deviation module 404, a direction module 406, an adjustment module 408, a persistence module 410, an ECC module 412, a distribution module 414, and a data set source module 422. FIG. 4 further depicts a write voltage module 416 that may be integrated with the read voltage module 352 or separate from the read voltage module 352. As described above with regard to the read voltage module 352 of FIG. 3A and FIG. 3B, the read voltage module 352 may be part of the read data pipeline 108, part of the solid-state storage media 110, or the like, such that the read voltage module 352 may adjust a read voltage threshold for one or more storage cells of the solid-state storage media 110.

In one embodiment, the data set read module 402 reads a data set from storage cells of the solid-state storage media 110. The data set read module 402 may read the data set either directly or indirectly from the solid-state storage media 110. For example, in one embodiment, the data set read module 402 may receive the data set from another module or element in the read data pipeline 108, the solid-state storage media 110, or the like.

In one embodiment, the data set read module 402 reads the data set in response to a testing operation and the data set may be a sample data set read as part of the testing operation. In a further embodiment, the data set read module 402 reads the data set in response to a read request from a client and the data set may be a data set that the client requested. The data set, in one embodiment, may be a full packet, a portion of a packet, or the like. In another embodiment, a size of the data set may be set by the test operation, by a read request from a client or the like. In a further embodiment, the data set may be raw data from the solid-state storage media 110, independent of packets or other data structures.

The data set, in a further embodiment, was originally stored in the storage cells with a known bias. For example, the data set may be from a packet that the bias module 318 biased, may be from storage cells of the solid-state storage media 110 that are in a virgin state, storing default data or other data programmed to the solid-state storage media 110 with a known bias for example by a manufacturer of the solid-state storage media 110, or the like.

In one embodiment, the data set may be sized relative to a biasing scheme that the bias module 318 employs to bias packets. For example, in one embodiment, the data set may be sized based on the period of a deterministic sequence, such as a pseudorandom binary sequence that the bias module 318 uses to bias packets. The closer the size of the data set is to an integer multiple of the period of the pseudorandom binary sequence, the more likely it is that the bias of the resulting data set will match the known bias. In a further embodiment, the bias module 318 may guarantee that a data set of a predefined size has a bias that does not deviate from the known bias by more than a threshold amount. The threshold amount may range from zero to a given integer value or percentage value.

As described above, a bias is a preference, probability, or tendency of values for bits within a set of bits to exhibit a specific data pattern. In one embodiment, the known bias is a known ratio of binary ones and binary zeroes within a set of bits or groupings of sets of bits. The known ratio, in one embodiment, may be expressed as a proportion or percentage between zero and one, a ratio of zero representing a bias of exclusively one value and a ratio of one representing a bias of exclusively the other value. In one embodiment, the known ratio is greater than zero and less than one, meaning that the known ratio is offset between a ratio of exclusively one binary value and a ratio of exclusively the opposite binary. If the known ratio is greater than zero and less than one, a deviation in the read bias of the data set may occur in either direction from the known ratio and still remain detectable by the read voltage module 352.

In the depicted embodiment, the data set read module 402 includes a monitor module 418 and a read error module 420. The data set read module 402, in one embodiment, may read the data set using the monitor module 418 and/or the read error module 420.

In one embodiment, the monitor module 418 monitors data sets that are read from the solid-state storage media 110 in response to read requests from a computer 112 or other client 114. The monitor module 418 may monitor each data set that is read from the solid-state storage media 110 or may select certain data sets that are read from the solid-state storage media 110, at predefined intervals, in response to a command or directive from a storage client, or the like. By using the monitor module 418 to monitor data sets that are read from the solid-state storage media 110, the read voltage module 352 may adjust read voltage thresholds for the solid-state storage media 110 dynamically, preventing uncorrectable data errors from occurring.

In one embodiment, the read error module 420 reads the data set in response to a data error identified in the data set. For example, the ECC decoder 322 or another module may determine that a data error has occurred. In one embodiment, the data error is an uncorrectable bit error that the ECC decoder 322 does not have enough information to correct. Specifically, the ECC decoder 322, in one embodiment, is configured to detect and correct up to a certain number of bits (# of Bits in Error—#BER) in error in a data set. When the number of bits in error exceeds the #BER, the ECC decoder 322 may signal an uncorrectable data error, an uncorrectable bit error, or the like.

The data error may occur due to a shift in a voltage level retained in one or more storage cells of the solid-state storage media 110. This retained voltage level of a storage cell is referred to herein as a read voltage level. The read error module 420, in one embodiment, reads the data set as part of a testing operation. The read voltage module 352 may conduct the testing operation in response to the data error, in response to a scheduled maintenance operation, in response to an initial calibration operation, or the like. The data set used by the read error module 420 may come from a client-requested packet, or may be sample data read as part of the testing operation.

In certain embodiments, the data set read module 402, when reading a data set of sample data in response to a testing operation, periodically, during monitoring, or the like, may size the sample data set to fit within excess read bandwidth of the solid-state storage media 110. By sizing sample data to fit within excess read bandwidth of the solid-state storage media 110, in one embodiment, reading the sample data may not affect a read bandwidth for servicing read requests to the solid-state storage media 110 or a read throughput of the solid-state storage media 110. In one embodiment, the data set read module 402 may read a data set from the solid-state storage media 110 with a greater amount of data than is requested by a read request to provide a greater sample size of bits for the read voltage module 352 to use to determine an adjustment to a read voltage threshold, or the like. A sample size that is greater than an amount of data requested, in certain embodiments, may improve the accuracy of a read voltage threshold adjustment.

For example, if a user application requests 512 bytes of data, and the solid-state storage media 110 can read 800 bytes of data in a read request at substantially the same speed as 512 bytes of data, in one embodiment, the data set read module 402 may read a data set of 800 bytes for adjusting a read voltage threshold, and provide the requested 512 bytes (a subset of the 800 byte data set) to the user application without affecting the read time of the operation. In one embodiment, the data set read module 402 sets a minimum data set request size and retrieves at least the minimum data set request size amount of data for each read request, even if the read request is for less than the minimum data set request size. The minimum data set request size, in certain embodiments, may be selected to fit within a boundary of one or more ECC chunks, one or more pages, one or more erase blocks, within excess bandwidth of the solid-state storage media 110, or the like. In one embodiment, the minimum data set request size may be selected based on an architecture or geometry of the solid-state storage media 110, the read data pipeline 108, or the like.

In one embodiment, the deviation module 404 determines that a read bias for a data set deviates from a known bias with which the data set was originally stored. The read bias of the data set deviates from the known bias when there is a difference between the read bias and the known bias. In one embodiment, where the known bias is exact, such as where the known bias includes error corrected bit values or where the bias module 318 biases to an exact bias, the deviation module 404 may determine that any difference between a read bias and the known bias comprises a deviation from the known bias. In other embodiments, the known bias may include an average bias, an estimated bias, a distribution of biases, a range of biases, or the like. The deviation module 404, in these embodiments, may determine that a read bias outside of a range or distribution of known biases, at least a predefined deviation threshold away from a known bias, or the like deviates from the known bias.

In one embodiment, the difference between the read bias of the data set and the known bias may be a difference in the ratios of binary ones and binary zeroes. In other embodiments, the difference between the bias of the data set and the known bias may be a difference in a binary pattern, a difference in multi-bit binary symbols, or the like. As described above with regard to FIG. 3B, in various embodiments, the deviation module 404 may receive an original, known bias and/or a read bias for a data set from the ECC decoder 322, from the inverse bias module 332, or the like.

The deviation module 404, in one embodiment, determines whether the read bias of the data set deviates from the known bias by comparing the read bias to the known bias. The deviation module 404 may compare the read bias to the known bias by counting the number of binary ones and the number of binary zeroes in the data set to determine the ratio of binary ones and binary zeroes in the data set and comparing that ratio to a ratio of the known bias. In a further embodiment, the deviation module 404 may search for and/or count the occurrences of an expected pattern or other expected attribute of the known bias and compare the results of a similar search and/or count in the data set to the expected attribute. In certain embodiments, the ECC decoder 322 indicates to the deviation module 404 that the read bias of the data set deviates from the known bias by providing an error bias for the data set to the read voltage module 352, or the like.

In embodiments where the known bias includes a pattern of bits, multi-bit binary symbols, or the like, the deviation module 404 may perform a transform on bits of the data set, may analyze a subset of bits of the data set, or the like to determine whether the read bias of the data set deviates from the known bias. For example, the deviation module 404 may perform a transform based on an encoding type used for storage cells of the solid-state storage media 110, such as a Gray code encoding type, a binary code encoding type, or the like. The transform, in certain embodiments, may be based on a physical and/or electrical architecture of the storage cells of the storage media 110.

For example, as described below with regard to FIG. 6C, a multi-level storage cell stores at least a most significant bit ("MSB") and a least significant bit ("LSB"). In certain embodiments, the MSB and the LSB, though part of the same physical multi-level storage cell, may be assigned to different pages of the solid-state storage media 110. In certain embodiments, a plurality of the multi-level storage cells are organized on the solid-state storage media 110 (such as NAND flash for example) as a physical page. In certain solid-state storage media 110, a physical page is the smallest unit that can be written to the solid-state storage media 110. In such embodiments, a multi-level storage cell may be associated with a page pair. A page pair is a pair of pages (upper and lower) that are associated with a single set of physical multi-level storage cells. For example, a multi-level storage cell may be associated with a page pair that includes an upper page and a lower page. An upper page may be associated with the MSBs, and the lower page may be associated with the LSBs, or vice versa.

Thus, the MSB and LSB in the same multi-level storage cell may have different addresses in the storage device 102. In certain embodiments, the upper page includes the MSBs of a plurality of multi-level storage cells, and the lower page includes the LSBs of the same multi-level storage cells. Writes directed to the upper page may therefore cause changes only in the MSBs of the associated multi-level storage cells, while writes directed to the lower page cause changes only in the LSBs of the associated multi-level storage cells.

As described in greater detail below with regard to FIG. 6C, in certain embodiments, the data set read module 402 may read a data set that includes only a subset of the bits stored by a grouping of multi-level storage cells, and the deviation module 404 may determine whether or not the read bias of the data set deviates from the known bias based on the subset of the bits. For example, a data set may include only data values from LSBs (lower pages), only values from MSBs (upper pages), or the like. In another embodiment, the deviation module 404 may determine whether or not a read bias of a data set deviates from a known bias based at least partially on an encoding type used for storage cells of the solid-state storage media 110, a physical and/or electrical architecture of the storage cells of the storage media 110, or the like. In other embodiments, the deviation module 404 may perform a transform on a data set that may combine data from different pages to include both LSB and MSB bits in a single data set, to coordinate LSB and MSB bits and/or pages from different data sets, or the like.

The deviation module 404, in one embodiment, checks the read bias of each data set that the data set read module 402 reads. For example, if the data set read module 402 uses the monitor module 418, the deviation module 404 may monitor the read biases of data sets regularly as they are read from the solid-state storage media 110. The monitor module 418, in one embodiment, may compare read biases of each data set that is requested by a client. In a further embodiment, the monitor module 418 may check read biases of requested data sets for example at regular intervals, and/or in response to a command, or the like. In another embodiment, if the data set read module 402 uses the read error module 420, the deviation module 404 may check the read bias of a data set in response to a data error, as part of a testing operation, or the like.

In one embodiment, the direction module 406 determines a direction of deviation for the data set. The direction of deviation, in one embodiment, is a difference between the read bias of the data set and the known bias. The direction or difference may be represented as a value, a sign (i.e. positive or negative), a relationship (i.e. greater than, less than), a direction (i.e. up, down), or the like. The direction module 406, in certain embodiments, may determine a direction of deviation based on an encoding type used for storage cells of the solid-state storage media 110, based on a physical and/or electrical architecture of the storage cells of the storage media 110, or the like. For example, the direction module 406 may examine the bias deviation in the data set to determine a direction of deviation based on a storage media type (2-bit MLC, 3-bit MLC, n-bit-MLC), which page of a multi-phase programming model was read, an encoding type for the solid-state storage media 110 (such as a Gray code encoding type, a binary code encoding type, or the like), and/or a magnitude of the determined deviation.

The direction module 406, in one embodiment, may determine the direction by subtracting a ratio, proportion, or other representation of the known bias from a representation of the read bias of the data set. For example, in one embodiment, the direction module 406 may subtract the proportion of binary ones, zeroes, multi-bit binary symbols, or the like that are expected based on the known bias from the proportion of binary ones, zeroes, multi-bit binary symbols, or the like that are in the data set. Depending on whether ratios of binary ones are compared or ratios of binary zeroes are compared and whether a high voltage represents a binary one or a binary zero, or other specific architectures of the storage cells, the direction module 406 may invert the difference or perform another transform to determine the direction.

In embodiments where an error bias from the ECC decoder 322 is available, the direction module 406 may determine the direction of deviation based on one or more bits of the data set that are in error, as indicated by the error bias. In other embodiments, as described above with regard to FIG. 3B, the direction module 406 may combine directions based on input from the inverse bias module 332, the ECC decoder 322, and/or the device factor module 354 to determine a direction of deviation, or the like.

In one embodiment, a binary zero is represented by a voltage below the read voltage threshold and a binary one is represented by a voltage above the read voltage threshold. In one example, a data set is stored with a known bias of 0.5, representing that the expected bias of the data set should be one half binary ones, or DC balanced. In this example, the data set is read from the storage cells and the data set has a read bias of 0.7, meaning that seventy percent of the data bits are binary ones. To determine the direction, in one embodiment, the direction module 406 subtracts the expected bias, 0.5, from the read bias of the data set, 0.7, for a direction of 0.2. The direction may be the entire result (i.e. "0.2"), the sign of the result (i.e. "positive"), a relationship (i.e. "greater than"), a direction, (i.e. "up"), or another indicator that represents the difference between the expected bias of 0.5 and the read bias of 0.7.

In another example, if the read bias of the data set is 0.3, meaning that thirty percent of the data bits are binary ones, the direction module 406, in one embodiment, would subtract the expected bias, 0.5, from the read bias of the data set, 0.3, for a difference of −0.2. In this example, the direction would be the opposite of the first example, i.e. "−0.2," "negative," "less then," "down," or the like.

Because the expected bias is known, comparing a read bias relative the known bias indicates that certain bits which should have satisfied the known bias presently do not, which may be due to a data error or due to changes in the voltage level stored in the storage cells after they were written. In addition, determining that the difference is positive or negative indicates whether the read voltage should be increased or decreased such that a re-read of the data set will result in a read bias that is the same as, or comes closer to the known bias. In one embodiment, the read voltage module 352 adjusts the read voltage level in the same direction as the direction indicated by the direction module 406.

Advantageously, having an indication as to which direction to adjust the read voltage threshold provides a significant reduction in time and resources needed to identify a new adjusted read voltage level. If the direction in which to make a read voltage threshold was unknown, identifying a new read voltage threshold may require a labor and time intensive process of trial and error as different possible read voltage thresholds are set and then tested and then adjusted as needed. The process may be needed to find a read voltage threshold that results in a re-read of the data packet substantially matching the known bias.

In one embodiment, the adjustment module 408 adjusts a read voltage threshold for the storage cells of the solid-state storage media 110 based on the direction of deviation that the direction module 406 determines. The adjustment module 408, in one embodiment, may adjust the read voltage threshold in the direction of deviation, away from the direction of deviation, or the like. For example, in one embodiment, the adjustment module 408 may raise the read voltage threshold from a previous read voltage threshold in response to the direction module 406 detecting more binary ones than expected in the known bias and lower the read voltage threshold in response to fewer binary ones than expected. While the relative directions may change based on characteristics of the storage cells of the solid-state storage media 110 and the storage scheme employed, the adjustment module 408 adjusts the read voltage threshold to correct or compensate for the difference determined by the direction module 406.

In a further embodiment, the adjustment module 408 determines an amount to adjust the read voltage threshold based on an amplitude of the direction or amplitude of the difference determined by the direction module 406. In another embodiment, the adjustment module 408 may scale or otherwise adjust the amplitude from the direction module 406 and adjust the read voltage threshold the adjusted amount. For example, the adjustment module 408, in one embodiment, may adjust the read voltage threshold by several adjustment levels in a single adjustment, based on the amplitude of the direction. In a further embodiment, the adjustment module 408 may select an amount to adjust the read voltage threshold based on additional factors such as age, amount of wear, usage history, error history, or other aspects of the solid-state storage media 110. As described above with regard to FIG. 3B, in certain embodiments, the adjustment module 408 may make a read voltage threshold adjustment based on one or more statistics for the solid-state storage device 102 that the read voltage module 352 receives from the device factor module 354.

In another embodiment, the adjustment module 408 uses a search algorithm to determine the read voltage threshold based on the direction of deviation. For example, the range of voltages in the direction of deviation from the current read voltage threshold may be the search space for the search algorithm. The adjustment module 408, in one embodiment, may use a linear search, a binary search, or the like to determine the read voltage threshold. To check each step as part of the search algorithm, the data set read module 402 may re-read the data set in response to each adjustment, and the deviation module 404 may re-determine whether the read bias of the re-read data set deviates from the known bias. The direction module 406 may re-determine a direction of deviation for the re-read data set to further the search. The adjustment module 408 may iteratively readjust the read voltage threshold based on the re-determined direction of deviation until the deviation module 404 determines that the read bias of a re-read data set does not deviate from the known bias, or until each of the read voltage threshold level has been tested, and/or until the data set can be corrected using ECC checkbits, or the like.

In one embodiment, the adjustment module 408 stops readjusting a read voltage threshold once a retry threshold is satisfied. For example, if the ECC decoder 322 cannot correct a data error and/or if the read bias for the data set continues to deviate from the known bias when a retry threshold for the data set is satisfied, the adjustment module 408 may cease making adjustments to the read voltage threshold. The retry threshold may be selected based on a set of possible read voltage threshold levels, or the like. In one embodiment, a retry threshold sets a number of times which the adjustment module 408 may adjust a read voltage threshold. In another embodiment, a retry threshold may set an amount of time in which the adjustment module 408 may make read voltage threshold adjustments. The solid-state storage controller 104, in certain embodiments, may take further remedial action in response to the retry threshold being satisfied, such as retiring the storage cells associated with the data set, logically replacing the storage cells associated with the data set, or the like.

In one embodiment, the adjustment module 408 does not adjust a read voltage threshold, even if the deviation module 404 determines that the read bias of a data set deviates from the known bias, a data error has occurred, a retry threshold has not been met, or the like. The adjustment module 408, in certain embodiments, may selectively adjust a read voltage threshold based on one or more risk factors associated with an adjustment to a grouping of storage cells. For example, risk factors may include an error rate for the grouping of storage cells (such as an UBER or the like), an erase cycle count for the grouping of storage cells, a storage request latency for the grouping of storage cells (such as an average, maximum, or other storage request execution latency), an age of the grouping of storage cells, a number of previous adjustments to a read voltage threshold of the grouping of storage cells, and/or other potential risk factors. In one embodiment, the adjustment module 408 may cancel or delay an adjustment to a read voltage threshold in response to one or more risk factors satisfying a risk threshold. In a further embodiment, the solid-state storage controller 104 may take further remedial action in response to one or more risk factors satisfying a risk threshold.

The adjustment module 408, in one embodiment, adjusts the read voltage threshold using a procedure or command provided by a manufacturer of the solid-state storage media 110. For example, in one embodiment, the adjustment module 408 may adjust the read voltage threshold by writing a value to a settings register of the solid-state storage media 110, sending a read voltage threshold parameter to the solid-state storage media 110, or otherwise communicating an adjustment to a read voltage threshold to the solid-state storage media 110. The adjustment module 408 may communicate the adjustment as an absolute value of a read voltage threshold, an amount to adjust the read voltage threshold, or the like. In a further embodiment, the solid-state storage media 110 provides a plurality of discrete levels (i.e. between 2 and 15 different levels) to which the read voltage threshold may be adjusted. In other embodiments, the magnitude of a read voltage threshold adjustment may be defined or recommended by a manufacturer or vendor of the solid-state storage media 110.

The adjustment module 408, in one embodiment, adjusts the read voltage threshold individually for a die, chip, PEB, or other discrete segment of the solid-state storage media 110. The adjustment module 408, in a further embodiment, adjusts multiple read voltage thresholds for each storage cell. For example, in one embodiment, the storage cells of the solid-state storage media 110 are MLC storage cells, with multiple read voltage thresholds per cell (i.e. a 2 bit MLC storage cell may have three distinct read voltage thresholds). The adjustment module 408 may move each of the multiple read voltage thresholds together or it may move them independently.

In embodiments where the storage cells have multiple read voltage thresholds, each read voltage threshold is separated by a separation distance. In one embodiment, the separation distances are uniform between each read voltage threshold. In a further embodiment, the adjustment module 408 adjusts the multiple read voltage thresholds with a single command or procedure and the separation distances between the multiple read voltage thresholds scale with the adjustment. For example, in one embodiment, the separation distances between read voltage thresholds may increase with larger read voltage thresholds and decrease with lower read voltage thresholds. Scaling the separation distances between read voltage thresholds upon adjustment, in one embodiment, provides a more even distribution of read voltage thresholds, so that the ranges of voltages at the ends of the ranges are not reduced or enlarged while middle ranges remain the same.

In one embodiment, the persistence module 410 stores a state of the read voltage threshold. The persistence module 410, in one embodiment, is part of the solid-state storage controller 104. The persistence module 410, in another embodiment, may send the read voltage threshold to the solid-state storage media 110 with each read operation. In a further embodiment, the persistence module 410 is part of the solid-state storage media 110, causing the solid-state storage media 110 to retain adjustments to the read voltage thresholds that the adjustment module 408 makes. The persistence module 410, in one embodiment, stores multiple read voltage thresholds, each read voltage threshold for a different segment or grouping of storage cells of the solid-state storage media 110.

In one embodiment, a manufacturer of the solid-state storage media 110 provides a command or procedure to adjust a read voltage threshold for a predefined grouping of storage cells, such as a chip, physical erase block, physical page, or a die. In a further embodiment, the persistence module 410 stores read voltage thresholds for sub-groupings of storage cells that are smaller than the predefined groupings of storage cells for which the adjustment module 408 can make adjustments using the manufacturer provided command or procedure. The adjustment module 408 may then, in another embodiment, readjust the read voltage threshold when a data set is read from a sub-grouping based on the read voltage thresholds that the persistence module 410 stores. Examples of sub-groupings may include PEBs, pages, ECC chunks, or other physical or logical divisions of a grouping of storage cells.

For example, in response to a read request for a data set from a first sub-grouping of storage cells, the adjustment module 408 may adjust the read voltage threshold of the entire grouping of storage cells to a level that the persistence module 410 stores for the first sub-grouping. In response to a read request for a data set from a second sub-grouping, in one embodiment, the adjustment module 408 may readjust the read voltage threshold for the entire grouping to a level that the persistence module 410 stores for the second sub-grouping. This allows the read voltage module 352 to adjust the read voltage thresholds for the solid-state storage media 110 at a finer scope than may be provided for in commands or procedures available for the solid-state storage media 110. For example, a manufacturer may provide a command, procedure, or methodology for adjusting a read voltage threshold for a die, chip, or other grouping of storage cells and the adjustment module 408 may adjust read voltage thresholds for individual PEBs or other sub-groupings in accordance with that command procedure or methodology.

In one embodiment, the read voltage module 352 processes the data set in response to an uncorrectable (meaning herein uncorrectable by the ECC decoder 322, as discussed herein a correction may be possible after an adjustment of the read voltage threshold) data error, as described above, and adjusts the read voltage threshold one or more times until the data error is no longer uncorrectable and can be repaired using ECC checkbits for the data set. In one embodiment, the ECC module 412 cooperates with the ECC decoder 322 to determine whether or not the ECC decoder 322 can correct an error in the data set. Alternatively, the read voltage module 352 cooperates with the ECC decoder 322 to determine whether or not the ECC decoder 322 can correct an error in the data set.

The read voltage module 352, in one embodiment, repeats the processing steps described above until the ECC module 412 determines that the ECC decoder 322 can correct the error. For example, in a further embodiment, the data set read module 402, the deviation module 404, the direction module 406, and the adjustment module 408 may repeatedly read the data set, determine that the read bias for the data set deviates from the known bias, determine the direction of deviation for the data set, and adjust the read voltage threshold as described above until the ECC module 412 determines that the ECC decoder 322 can correct the error.

Figure 6A:
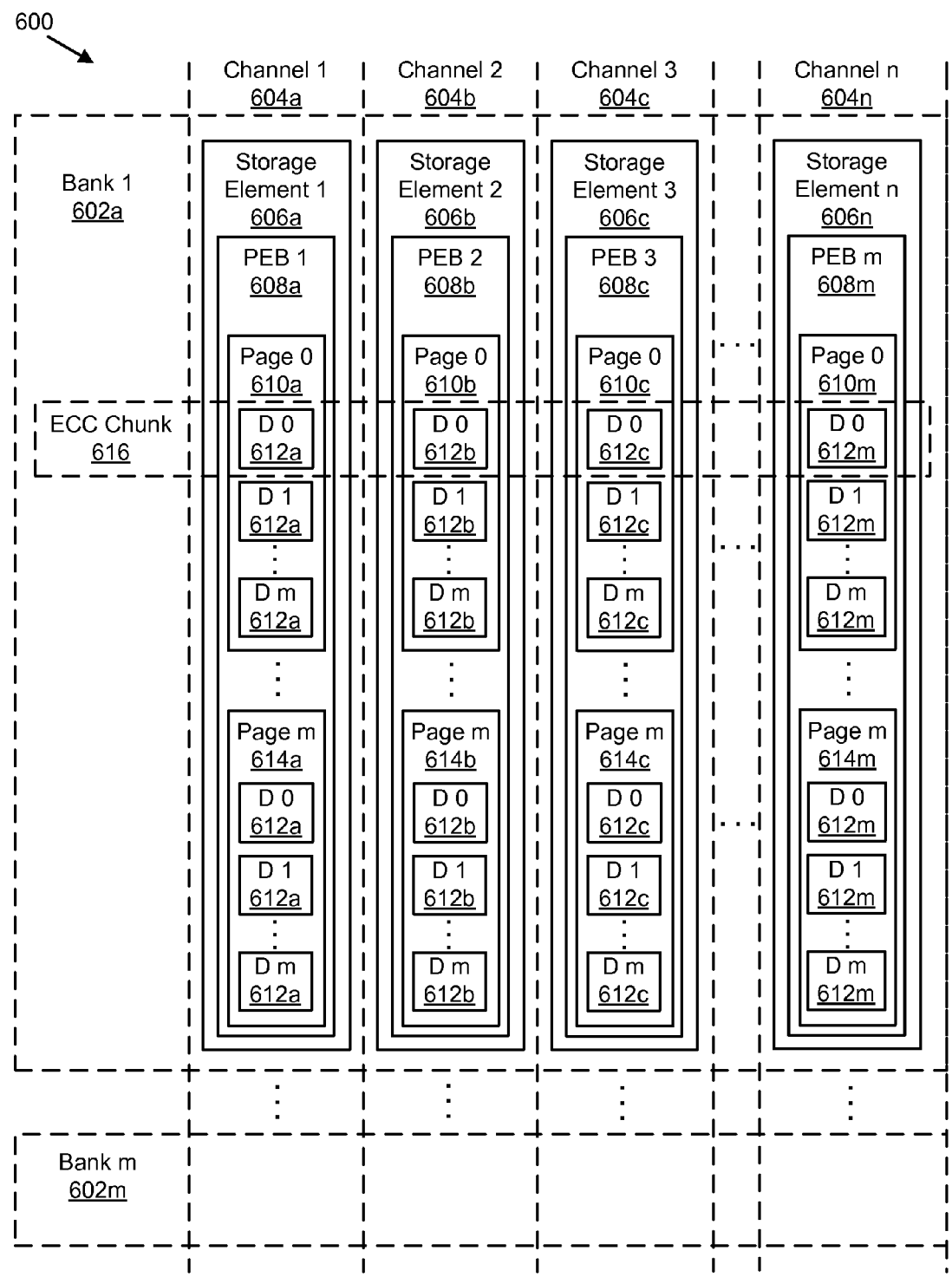
FIG. 6A is a schematic block diagram illustrating one embodiment of an array of storage elements of solid-state storage media in accordance with the present invention.
Figure 6B:
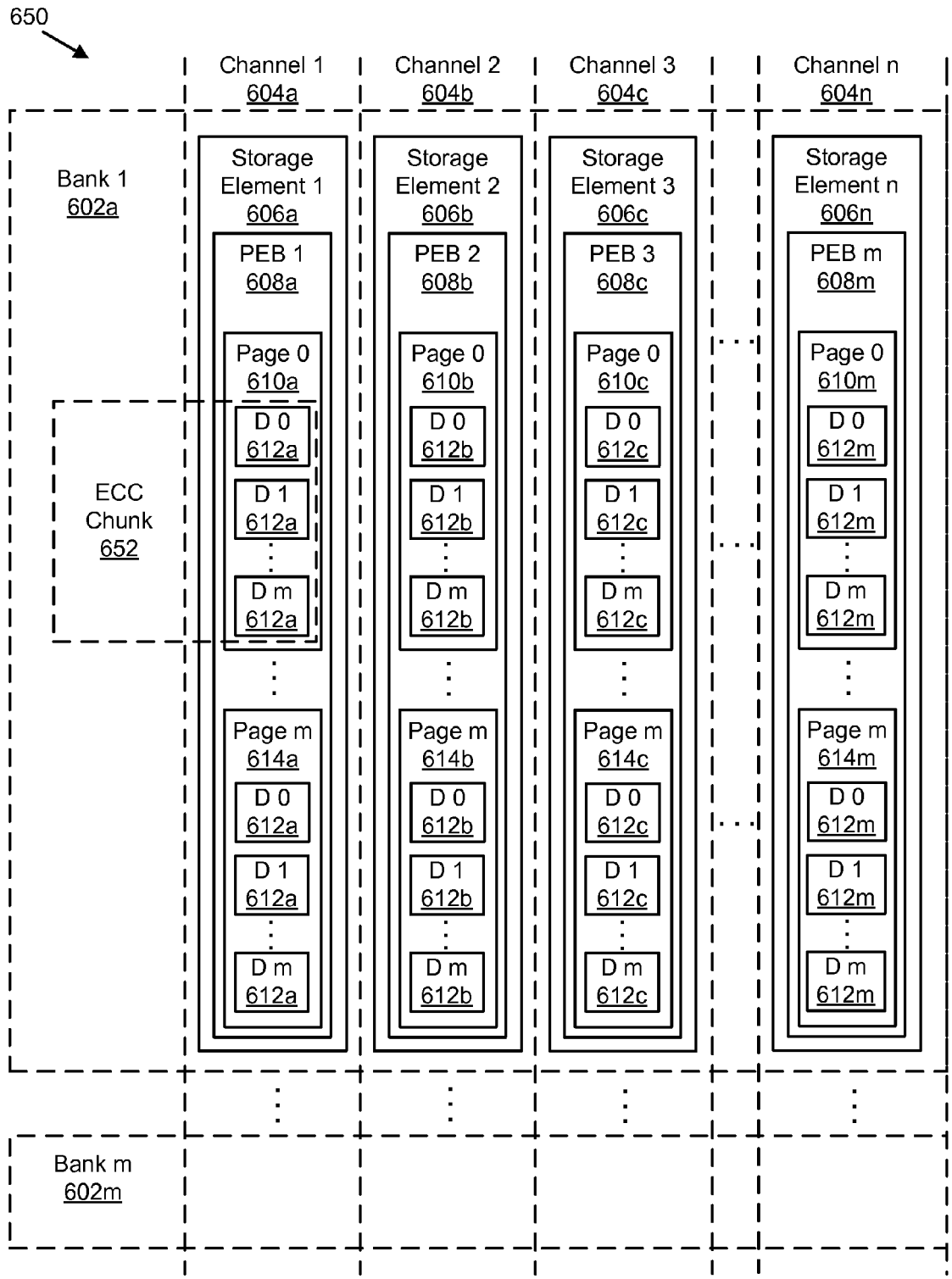
FIG. 6B is a schematic block diagram illustrating another embodiment of an array of storage elements of solid-state storage media in accordance with the present invention.

As described in greater detail with regard to FIGS. 6A and 6B, in one embodiment, a data set may be stored across several dies, chips, channels, storage elements, PEBs, or other grouping of storage cells. ECC checkbits, in one embodiment, may be calculated and stored independently for each grouping of storage cells. In another embodiment, the ECC checkbits, stored together with each grouping of storage cells, for example as part of an ECC chunk.

In a further embodiment, the ECC module 412 uses ECC checkbits to determine in which die, chip, channel, storage element, PEB, or other grouping of storage cells of the solid-state storage media 110 an uncorrectable error has occurred. The ECC module 412, in one embodiment, verifies data sets of each grouping of storage cells using ECC checkbits to determine which particular grouping from a set of groupings of storage cells have uncorrectable errors. The read voltage module 352, in one embodiment, adjusts one or more read voltage thresholds in the particular groupings of storage cells with an uncorrectable error.

In one embodiment, the distribution module 414 determines that the read bias of the data set is within an expected distribution of the known bias, and that no additional adjustments of the read voltage threshold should be made. In a further embodiment, the data set read module 402, the deviation module 404, the direction module 406, and the adjustment module 408 continue to re-read the data set with a new read voltage threshold, re-determine that the read bias for the data set deviates from the known bias, re-determine the direction of deviation for the data set, and readjust the read voltage threshold until the distribution module 414 determines that the read bias of the data set is within the expected distribution.

The distribution module 414, in one embodiment, may cooperate with or be integrated with the deviation module 404. In one embodiment, the read voltage module 352 uses either the ECC module 412 or the distribution module 414 to determine when adjustment of the read voltage threshold should be made or is complete. In a further embodiment, the distribution module 414 compares read biases of data sets from several dies, chips, channels, storage elements, PEBs, or other grouping of storage cells of the solid-state storage media 110 to the distribution of the known bias to determine in which grouping of storage cells an error has occurred, and the read voltage module 352 adjusts one or more read voltage thresholds in a grouping of storage cells with an error.

In one embodiment, the ECC module 412 and/or the distribution module 414 cooperate with the data set source module 422. The data set source module 422, in one embodiment, determines from which specific grouping of storage cells the data set was read. For example, the data set source module 422 may determine which die, chip, channel, storage element, PEB, or other grouping of storage cells is the source of the data set. In one embodiment, the data set source module 422 determines from which specific grouping of storage cells the data was read in response to the deviation module 404, the ECC module 412, and/or the distribution module 414 determining that the data set has a read bias that deviates from a known bias, has a data error, or the like.

In one embodiment, the data set source module 422 determines from which specific grouping of storage cells the data set was read based on a position of the data set within a sequence of data sets. For example, in one embodiment, the solid-state storage media 110 may comprise a plurality of groupings of storage cells, and each grouping of storage cells may be read in parallel during a read operation. The data set source module 422, in one embodiment, may use known information about how the write data pipeline 106 and/or the read data pipeline 108 processes data, and known information about the plurality of groupings of storage cells, to determine from which grouping of storage cells the data set was read.

For example, in one embodiment the write data pipeline 106 and the read data pipeline 108 may each have a 64 bit (8 byte) data path, the solid-state storage media 110 may comprise a 24 die wide array, and 8 bytes may be read in parallel from each of the 24 dies during a read operation, for a total of 192 bytes per read operation. Based on this information, the data set source module 422, in one embodiment, can determine from which die or other grouping of storage cells, a data set was read based on the position of an 8 byte data set within the 192 bytes.

The data set source module 422, in a further embodiment, may count or otherwise track the number of data sets processed as part of a read operation to determine the position of the data set in the sequence of data sets. For example, 8 bytes may be read in sequence from the 24 die starting with a first die, thus if the ECC module 412 and/or the distribution module 414 detects a read bias deviation or a data error during operations on the fifth 8 byte set of data, the data set source module 422 identifies that this 8 byte set of data came from the fifth die of the 24 die.

By using the position of the data set in a sequence of data sets and other known information, the data set source module 422, in one embodiment, can determine the grouping of storage cells from which the data set was read without using an identifier or other external information. Identifying the die, chip, channel, PEB, or other grouping of storage cells that exhibit the read bias difference permits prompt remedial actions to be taken such as changing the read voltage threshold, logical swapping of the grouping of storage cells with a reserved grouping, and other forms of remedial action.

In one embodiment, the write voltage module 416 sets a write voltage level for writing data to the storage cells of the solid-state storage media 110. The write voltage level is a programming voltage that specifies the minimum or maximum voltage used to program or change a state of a storage cell. For example, for NAND flash solid-state storage, the write voltage changes the state of a storage cell from a binary one to a binary zero. The write voltage module 416, in one embodiment, writes known patterns to the storage cells, then reads the pattern back determining the read voltage threshold, and adjusts the write threshold until the desired read threshold is met. The write voltage module 416, in a further embodiment, adjusts the write voltage level based on a mathematical model that specifies write voltage level values based on endurance and data retention requirements of a storage cell relative to an age of the storage cell. In one embodiment, the age of the storage cell is computed in terms of program and erase cycles. The write voltage module 416, in one embodiment, performs a test write to one or more storage cells, detects the read voltage of at least one of the storage cells, and adjusts the write voltage level until the read voltage meets a threshold value. The write voltage module 416, in a further embodiment, performs the test write by writing a data set with a known bias to the storage cells, and tests the read voltage by determining if a read bias of the read data set deviates from the known bias.

The write voltage module 416, in one embodiment, may begin with a minimum write voltage, and increase the write voltage until the read voltage meets a threshold value. In a further embodiment, the write voltage module 416 may begin with a maximum write voltage, and decrease the write voltage until the read voltage meets a threshold value. The write voltage module 416, in one embodiment, may select a write voltage level that balances the time to program the storage cells with a desired endurance and/or data retention for the storage cells.

Data Biasing

Figure 5A:
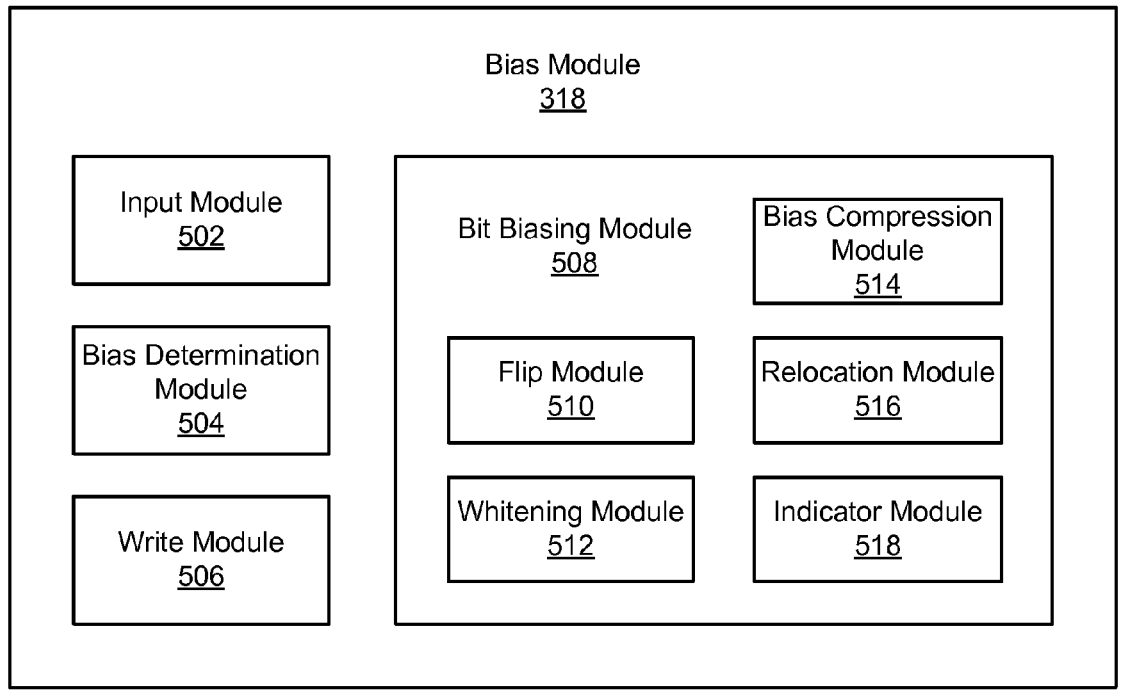
FIG. 5A is a schematic block diagram illustrating one embodiment of a bias module in accordance with the present invention.

FIG. 5A is a schematic block diagram illustrating one embodiment of the bias module 318 in accordance with the present invention. In the depicted embodiment, the bias module 318 includes an input module 502, a bias determination module 504, a write module 506, and a bit biasing module 508. In a further embodiment, one or more modules may be omitted from the bias module 318 or may be located external to the bias module 318. As described above with regard to FIG. 3A, the bias module 318 receives a data packet of source data and biases bits of the data packet toward a bias of storage cells in the solid-state storage media 110.

In one embodiment, the input module 502 receives the data packet of source data to be stored in the storage cells of the solid-state storage media 110. The input module 502, in one embodiment, receives the data packet directly or indirectly from an element in the write data pipeline 106, such as the packetizer 302 or another element in the write data pipeline 106. In a further embodiment, the bias module 318 is independent of, and separate from, the write data pipeline 106, and the input module 502 may receive the data packet from a different bus, buffer, module, or the like for storage in the storage cells of a non-volatile solid-state storage media 110, such as the solid-state storage media 110.

In one embodiment, the bias determination module 504 determines that a source bias of the data packet that the input module 502 receives is different from a bias of the storage cells. As described above with regard to the bias module 318 of FIG. 3A, a bias is a preference, probability, or tendency of values for bits within a set of bits to exhibit a specific data pattern, such as toward binary ones, toward binary zeroes, toward a balance of binary ones and zeroes, toward a certain binary value of several bits, or the like. The bias determination module 504 may make a determination for the entire data packet, or for subsets of the data packet.

The bias determination module 504, in one embodiment, determines the number of bits of each binary value within the data packet. The bias determination module 504 may determine that the source bias is different than the bias of the storage cells using one or more predefined thresholds or ranges of biases. The thresholds or ranges may be selected based on a type of biasing performed by the bit biasing module 508, as discussed below. For example, in one embodiment, the bias determination module 504 may determine that the source bias of the data packet is different from the bias of the storage cells in response to more than fifty percent of the bits of the data packet differing from the bias of the storage cells.

In one embodiment, the bit biasing module 508 biases the bits of the data packet that the input module 502 receives toward the bias of the storage cells. To bias the data packet, the bit biasing module 508 may bias the bits of the entire data packet, or of one or more subsets of the data packet. For example, the bit biasing module 508, in various embodiments, may bias both header data (or other metadata) and user data within the data packet, may just bias user data, may bias selected chunks of the data packet, or the like.

The bit biasing module 508, in one embodiment, biases the bits of the data packet in response to the bias determination module 504 determining that the source bias of the data packet is different from the bias of the storage cells. In a further embodiment, the bit biasing module 508 biases the bits of each data packet, regardless of a source bias of the data packet. In yet another embodiment, the bit biasing module 508 biases the bits of each data packet, based on an expected or anticipated source bias of the data packet.

In the depicted embodiment, the bit biasing module 508 includes a flip module 510, a whitening module 512, a bias compression module 514, a relocation module 516, and an indicator module 518. The bit biasing module 508, in one embodiment, uses one or more of the flip module 510, the whitening module 512, and the bias compression module 514 to bias the bits of the data packet toward the bias of the storage cells.

In one embodiment, the flip module 510 flips binary values of the bits of the data packet to satisfy the bias of the storage cells. It should be noted that while groups of data are referenced herein using the term "data packet," those of skill in the art recognize that a data packet is a collection of data not limited to a particular physical construct such as a data bus width, physical storage page size or the like. The term "data packet" as used herein refers to any collection of data whether determined by a physical architecture or determined by a logical data structure construct. Consequently, references to data packet may be suitably replaced with ECC chunk, logical page, logical erase block, and the like. As used herein, the term flipping a bit means inverting the binary value of the bit. The flip module 510, in one embodiment, flips the binary values in response to the determination by the bias determination module 504 that the source bias of the data packet is different than the bias of the storage cells.

For example, if the bias of the storage cells is toward binary ones, in one embodiment, the flip module 510 may flip the values of the bits of the data packet in response to the data packet being biased toward binary zeroes, meaning the source data packet has fewer than fifty percent binary ones. By flipping the bits of data packets that are biased toward binary zeroes, the flip module 510 forms a resulting biased data packet that is biased toward binary ones, having more than fifty percent binary ones. In one embodiment, the size of the data packet is known, therefore the flip module 510 readily determines when the number of bits with binary zeros exceeds fifty percent. In this manner, even if the distribution of data packets having a bias toward binary one and a bias toward binary zero is a normal distribution (bell curve), the flip module 510 effectively folds the half of the bell curve for data packets having a bias toward binary zero on top of the half of the bell curve for data packets having a bias toward binary one. The net effect is that the flipped data packet becomes more biased towards ones. In another embodiment, the flip module 510 flips data packets to bias them toward binary zeroes. In a further embodiment, for example when a majority of data packets have a source bias that is different than the bias of the storage cells, the flip module 510 may flip each data packet regardless of the source bias of the data packet.

In one embodiment, the benefits of flipping a set of data (i.e. data packet, code word, ECC chunk, logical page, logical erase block, or the like) vary with the size of the data packet, and the data packet may be sized to balance benefits provided by the flip module 510 with the overhead of storing an indicator that a flip has been made to the set of data. In certain embodiments, the overhead of storing an indicator that the bias module 318 has performed a transformation on a set of data can be overcome by using previously reserved or unused bits in a header or other set of metadata stored on the solid-state storage media 110. For example in one embodiment, the ECC checkbits and other ECC code information uses all but n bits of an m bit data packet that stores the ECC check bits and ECC code information. For example suppose the ECC information is stored in a sixty four bit data packet (the "ECC packet") and seven bits are unused. One of these seven bits can be used to indicate whether all the bits of an ECC chunk associated with the ECC packet have been flipped. Alternatively, each of these seven bits can be used to represent whether any one of seven subsets of all the bits of an ECC chunk associated with the ECC packet have been flipped.

In certain embodiments, the size of the data packet is set such that flipping bit values by the flip module 510 yields a benefit a majority of the time. In this manner, there is no need to store an indicator of whether or not a bit flip has occurred because each data packet may be flipped by the bit biasing module 508 and unflipped by the inverse biasing module 332. The benefit of reducing wear on the storage cells may outweigh the overhead of flipping and un-flipping the bits, particularly where the storage cells are heavily biased to one binary value or the other.

In a further embodiment, the flip module 510 may flip subsets of the data packet individually, and the subsets may be sized to balance the benefits of flipping with the overhead of storing an indicator. For example, if the data packet (or data packet subset) is small, the benefits gained by flipping the bits may not outweigh the overhead of storing and tracking an indicator to indicate to the inverse bias module 332 that the bits have been flipped. Conversely, if the data packet is large, although the overhead of storing an indicator is minimized, flipping may have a smaller benefit, because the bits of a large data packet may more likely be balanced between binary ones and zeroes. In another embodiment, the data packet (or data packet subsets) may be sized based on a size of a storage region in the solid-state storage media 110, a size of a bus or buffer, a number of extra bits available for storage of an indicator, or the like.

In one embodiment, the whitening module 512 pseudo-randomizes the values of the bits of the data packet. As used herein, the terms "whiten," "whitening," and "whitened" refer to a transformation of binary data values in a given set of data that shifts the bias of binary one or zeros toward an opposite bias. In certain situations, the bias shift caused by whitening comprises changing a distribution of binary ones and binary zeros to a more even distribution. The whitening module 512 pseudo-randomizes the values of the bits in a reversible manner, such that the inverse bias module 332 may convert the bits of the biased data packet back to its original source data state. The whitening module 512, in various embodiments, may use encryption, scrambling, or other randomization methods to pseudo-randomize the values of the bits of the data packet.

The whitening module 512, in a further embodiment, may pad source data, such as a data packet, with padding data that biases the source data toward a certain bias. For example, to bias a data packet toward binary ones, the whitening module 512 may pad source data with binary ones. By adding extra padding data to source data, in certain embodiments, the whitening module 512 can achieve a target bias exactly, such as an exact equal number of binary ones and binary zeroes, or the like. In other embodiments, it may be undesirable to exactly match a bias.

In embodiments where the whitening module 512 pads source data, the whitening module 512 may add the padding data in a single location within the source data, interleave or spread the padding data reversibly through the source data, or otherwise add the padding data to the source data to bias the source data. In certain embodiments, padding source data expands or inflates a size of the source data. In other embodiments, as described below with regard to the bias compression module 514, compressing source data and adding padding data in the amount of space gained by compression biases the source data without increasing the size of the source data.

In one embodiment, the whitening module 512 uses encryption to pseudo-randomize the data packet. Encryption may, in one embodiment, bias the data packet toward a balance of binary ones and zeroes. In one embodiment, the whitening module 512 is substantially similar to the encryption module 314 described above with regard to FIG. 3A and may replace or be part of the encryption module 314. For example, the encryption module 314 may use an encryption routine that pseudo-randomizes the data in addition to or as part of encrypting the data.

In one embodiment, the whitening module 512 pseudo-randomizes the data packet by XORing a pseudorandom binary sequence or other deterministic pattern with the data packet. In a further embodiment, the whitening module 512 pseudo-randomizes the data packet using a galois-style Linear Feedback Shift Register ("LFSR"). In one embodiment, the pseudorandom binary sequence or other deterministic pattern is determinable by both the whitening module 512 and the inverse bias module 332 without storing additional data.

In one embodiment, the whitening module 512 pseudo-randomizes each data packet that will be stored on the solid-state storage media 110 using a single seed value for the LFSR. Alternatively or in addition, in another embodiment, the whitening module 512 pseudo-randomizes each data packet that will be stored in a particular logical erase block of the solid-state storage media 110 using a single seed value for the LFSR. A new seed value may be used for a subsequent logical erase block. Alternatively or in addition, in yet another embodiment, the whitening module 512 pseudo-randomizes each data packet that will be stored in a particular logical page of the solid-state storage media 110 using a single seed value for the LFSR. A new seed value may be used for a subsequent logical page. Alternatively or in addition, in yet another embodiment, the whitening module 512 pseudo-randomizes each data packet that will be stored in a particular ECC chunk on the solid-state storage media 110 using a single seed value for the LFSR. A new seed value may be used for a subsequent ECC chunk.

A seed value for generating the pseudorandom binary sequence may be used that is known or already accessible to both the whitening module 512 and the inverse bias module 332. The seed value may be determined using one or more known items such as addresses, sequence numbers, dates, times, or other data that is known or already stored together with or separate from the data packet and accessible to the whitening module 512 and the inverse bias module 332.

In one embodiment, the one or more known items may be entered into a hash function to generate the seed value, and the seed value may be entered into a pseudorandom number generator to generate the pseudorandom binary sequence. This allows both the whitening module 512 and the inverse bias module 332 to access or generate the pseudorandom binary sequence or other deterministic pattern without the overhead of storing additional data.

In a further embodiment, the whitening module 512 may use a sequence number or address of a logical erase block or other storage region of the solid-state storage media 110 that is associated with the data packet as a seed value. For example, in one embodiment, the solid-state storage controller 104 may store a sequence number or other seed value in a physical page of a solid state storage element in response to erasing the logical erase block. Alternatively, or in addition, in one embodiment, the solid-state storage controller 104 may store a sequence number or other seed value in a physical page of a solid state storage element in response to formatting, partitioning, or otherwise preparing the solid-state storage media 110 for use. The sequence number or other seed value is accessible to both the whitening module 512 and the inverse bias module 332, and provides a convenient seed value without additional storage.

The sequence number or other seed value, in certain embodiments, may be associated with a particular region of the solid-state storage media 110, such as a code word, data packet, data stripe, ECC chunk, physical page, logical page, physical erase block, logical erase block, or the like. In one embodiment, this association is represented by storing the sequence number or other seed value within a predefined location in the region. For example, where the region is a logical erase block, a predefined location may include a physical page of a physical erase block that is within the logical erase block, or the like. The sequence number, in a further embodiment, is a preset sequence number stored in the predefined location during an erase procedure, such as a garbage collection procedure, a grooming procedure, or the like. Each logical erase block or other region associated with a sequence number, in one embodiment, receives a new or updated sequence number in response to each erase procedure. Changing the sequence number each erase procedure, in certain embodiments, may enhance wear leveling and pseudo-randomization of data in a logical erase block or other region. In another embodiment, this association between a sequence number and a particular logical erase block is represented by an index or other metadata associating the sequence number or other seed value with the logical erase block.

In one embodiment, where a sequence number is used to manage a particular set of data (such as a code word, data packet, data stripe, ECC chunk, physical page, logical page, physical erase block, and logical erase block) on the solid-state storage media 110, further steps are taken to ensure that the binary values that represent the sequence number on the storage media is biased more towards a bias of storage cells of the media in an empty state. As used herein, "empty state" refers to the state of a storage cells prior to any data being written to the storage cell. In certain embodiments, an empty state may also include the state of a storage cell once the storage cell is erased. A field used to store the sequence number as binary values may have a fixed size (i.e. a fixed width). As sequence numbers are stored in the field, the field itself may exhibit a bias of fifty percent or higher towards all binary ones or binary zeros as the generated sequence numbers are used because the numbers are generated from an ordered sequence.

Therefore in certain embodiments, the binary data values that represent the sequence number are whitened to shift the bias of binary data values toward a bias that decreases wear on the storage cells over the life of the storage cells. For example, if the sequence number is biased towards binary zeros, shifting the bias toward an even a balance of binary ones and binary zeros will result in decreased wear on the storage cells over the life of the storage cells.

The storage controller 104 and/or read module 550 seeks to determine whether a data packet read includes a valid header. If a patterned header is used, the read module 550 would detect the presence of the pattern. However, storing a regular patterned header on the storage cells can increase wear on the cells. Therefore, in order to verify that a data packet is a valid header and avoid introducing patterned wear on the storage cells through a patterned header, the present invention biases the header data values such that each storage cell receives a balanced number of binary ones and binary zeroes. In certain embodiments, the bias imposed on the header data values is such that the biased header more closely reflects a bias of the binary values of the storage cells.

In one embodiment, a particular set of data read from the solid-state storage media 110, such as an erase block includes a header. The header comprises at least two fields. The first field may store a pseudorandom or random number that serves as a sequence number or seed that may be used by the bias module 318 and inverse bias module to bias and unbias sets of data (i.e. data packets). The second field may store a constant, predefined value in a transformed binary form, referred to herein as a magic number. The magic number is known to the bias module 318 and the inverse bias module 332. Those of skill in the art recognize that a magic number may be a constant value (numerical or text) chosen by a software developer to provide a reference number that can be used for different purposes such as identifying a file format or protocol and/or to determine that data integrity has been preserved throughout a transformation or storage operation.

In a certain embodiment, the SSS controller 104 stores the pseudorandom or random number in the first field and transformed magic number in the second field on the storage media. In one embodiment, the bit biasing module 508 biases the pseudorandom or random number and transformed magic number using one or more of the flip module 510, the whitening module 512, and the relocation module 516. In one embodiment, the transformed magic number is transformed by the whitening module 512 of the bit biasing module 508. The seed used by the whitening module 512 is the pseudorandom or random number in the first field. As a result, the whitening module 512 biases the magic number is whitened before being stored such that wear on the storage media is minimized.

In addition, the inverse bit biasing module 552 may be used to verify that the first field and second field represent a valid header field. In one embodiment, the whitening module 512 performs an exclusive OR (XOR) operation using the magic number and the pseudorandom or random number of the first field as inputs. The result is a transformed magic number that is stored in the second field. Alternatively, one or more other modules of the bias module 318 may bias the magic number and/or the pseudorandom or random number. Once the first and second fields are read, the inverse bit biasing module 552 XORs the transformed magic number and the pseudorandom or random number of the first field. If the result is the magic number, and no ECC errors have been signaled, then the header is valid. In addition, if the result is the magic number, and no ECC errors have been signaled, then the second field, the magic number, is known to have been biased by the bias module 318. Conversely, if the result is not the magic number, and no ECC errors have been signaled, then the second field, the magic number, is known to have not been biased by the bias module 318. Detecting that a header field has been biased by the solid-state controller 104 is advantageous in determining whether the contents of the data structure the header identifies has been biased.

Assigning a sequence number or other seed value as part of an erase procedure has the added benefit of tracking which logical erase blocks have been used by the solid-state storage controller 104. Unused, new logical erase blocks have no stored sequence number or other seed value, differentiating unused logical erase blocks from previously used logical erase blocks. In one embodiment, the sequence number or other seed value may be used by the encryption module 314 for media encryption, or may be otherwise used by the solid-state storage controller 104 for another purpose. As described above, in certain embodiments, the solid-state storage controller 104 changes or updates the sequence number for a logical erase block each erase procedure, further enhancing wear leveling, encryption, and/or other uses of the sequence number for biasing purposes.

In one embodiment, for example, the solid-state storage controller 104 may store a seed value in a beginning portion of each logical erase block that the solid-state storage controller 104 erases, in the first sixty-four bits, one hundred and twenty-eight bits, or the like. If the seed value is not stored in a logical erase block, the solid-state storage controller 104 can detect that a particular logical erase block has not been previously used (in other words the logical erase block is in the same state as when originally shipped from the manufacturer). The whitening module 512, in one embodiment, uses the sequence number or other seed value from a logical erase block to pseudo-randomize the bits of one or more data packets for storage in the logical erase block. As described above, the whitening module 512 may enter the sequence number or other seed value into a pseudorandom number generator or the like to generate a pseudorandom binary sequence.

Detecting what data structures have, and what data structures have not, been biased by the solid-state controller 104 may be useful in testing to determine how effective different bit biasing operations of the bit biasing module 508 are in reducing wear of storage cells of the storage media. Furthermore, detecting what groupings of data (packets, pages, erase blocks, die, etc.) on the storage media have been biased, and what groupings of data on the storage media have not been biased may be used to distinguish between storage cells that have been used to store data for the solid-state storage controller 104 (See FIG. 1) (referred to herein as "active storage cells") and storage cells that have not been previously used (in other words the storage cells are in the same state as when originally shipped from the manufacturer) (referred to herein as "original-state storage cells"). In certain embodiments, the bit biasing module 508 may intentionally leave certain regions of the solid-state storage media 110 unbiased, such as system metadata, boot data, recovery data, or the like, so that the regions may be accessed without inverse biasing by the inverse bias module 332, or the like.

Distinguishing between active storage cells which may have some form of biasing imposed by the storage controller 104 and original-state storage cells provides contextual information for other functions of the solid-state storage device 102. For example, the solid-state storage device 102 may use the context information when sequentially reading the stored data to reconstruct data or metadata indexes and other metadata based on data packet headers. The context information distinguishes active storage cells from original-state storage cells such that no end-of-file, or other indicator needs to be stored on the storage media.

In certain embodiments, in order to detect whether a bias has been imposed on active storage cells, the bias module 318 applies the bias to groupings of storage cells such as packets, ECC chunks, pages, erase blocks, and/or die. In addition or alternatively, the bias module 318 may apply a bias to one or more of headers, footers, or other metadata fields and not to all the data in a grouping. For example, as discussed above erased storage cells can be distinguished from original-state storage cells if the erase process includes biasing of, in one example, at least a header for the erase block. Original-state storage cells in such an embodiment would not have a biased header in the erase block.

In addition, in embodiments that distinguish between active storage cells and original-state storage cells, the bias module 318 is configured to not change the bias for data packets or other data structures for which the bias of the data structure exactly matches the bias of original-state storage cells. For example, if the original-state storage cells original state is a binary one, the bias module 318 may not impose any change in bias on a data packet having all binary ones. This feature coupled with a deterministic changing of bias for data packets having a bias different from the bias of the media storage cells enables the distinguishing of active storage cells from original-state storage cells.

Re-Arrangement

In one embodiment, the whitening module 512 pseudo-randomizes the bits of the data packet by rearranging them. While pseudo-randomizing the bits of the data packet using encryption (or Xoring the data packet with a pseudorandom binary sequence, also known as scrambling) changes the values of actual data bits stored in the data packet, pseudo-randomizing the bits of the data packet by rearranging them does not. Rearranging can bias a data packet by ensuring that each subset of the data packet is biased toward the bias of the storage cells. For example, while rearranging a data packet will not change the amount of binary ones or binary zeroes that are in the data packet, it may more evenly distribute them within the data packet. If the storage cells are biased toward a balance of binary ones and zeroes, for example, and the data packet has mostly binary ones at the beginning of the data packet, and mostly binary zeroes at the end of the data packet, rearranging the data packet will bias the data packet toward the bias of the storage cells. The whitening module 512 rearranges the bits of a data packet according to a reversible algorithm so that the inverse bias module 332 can place the bits of the data packet in their original source order by reversing the rearranging.

In one embodiment, the whitening module 512 rearranges the bits of the data packet in conjunction with one or more of the flip module 510, the bias compression module 514, and the relocation module 516. Rearranging the data packet, in one embodiment, may have additional benefits for the solid-state storage media 110 beyond satisfying a bias of the storage cells. For example, if consecutive data packets have repetitive patterns of data bits, pseudo-randomly rearranging the bits of the data packets prevents inconsistent wear in the storage cells. Without rearranging or other pseudo-randomization by the whitening module 512 (or shifting by the relocation module 516), certain bit positions in a header that consistently have the same binary value or other repeated patterns of data in consecutive data packets can wear out storage cells corresponding to those bit positions.

As described above with regard to randomization of bits (encryption in certain embodiments) by the whitening module 512, in one embodiment, the whitening module 512 rearranges the bits of the data packet deterministically, such that the inverse bias module 332 can convert the bits of the data packet to their original source order without using extra stored information. For example, the whitening module 512 may use one or more known values to pseudo-randomize the order of bits in the data packet, so that the inverse bias module 332 may use the same known values to convert the bits in the data packet to their original source order.

In one embodiment, the relocation module 516 rearranges the bytes within a physical page on the solid-state storage media 110 by pseudo-randomizing the order in which the bytes for the physical page are selected from a buffer, such as the write buffer 320, the write synchronization buffer 308, or the like. The whitening module 512 may utilize preexisting multiplexing ("MUXing") capabilities of the buffer. The pseudo-randomized selection order is both detectable and reversible by the inverse bias module 332. The inverse bias module 332 determines a reverse selection order and orders placement of bytes from a read physical page into a read buffer such as read sync, buffer 328. In this manner the data read from the read sync, buffer is in the same order as the data was originally in the output or write buffer 320. Those of skill in the art will recognize that this same rearrangement technique can be used for selecting packets for removal from the output buffer 320 and for placement into the read sync, buffer 328.

In one embodiment, the whitening module 512 rearranges the bits of the data packet by pseudo-randomizing the order in which the bits of the data packet are removed from a buffer, such as the write buffer 320, the write synchronization buffer 308, or the like. This randomizes the order of subsets of data within the data packet that are the size of the data path from the buffer, and may utilize preexisting multiplexing ("MUXing") capabilities of the buffer.

Advantageously, rearrangement of the bits, bytes, packets, and/or ECC chunks that are written to the solid-state storage media 110 serves to randomly distribute metadata within the written data structure that is often biased with a certain pattern of binary values. In addition, this metadata is often very patterned in the positioning of metadata such as headers, addresses, and other information. By rearranging the positioning of this metadata in a manner that is reversible, the wear on solid-state storage media 110, such as NAND flash, can be more evenly distributed.

In a further embodiment, the whitening module 512 performs one or more additional stages of rearrangement within each subset of data. For example, in an embodiment with data packets larger than sixty-four bits and a data path of sixty-four bits from a buffer, initially the whitening module 512 may scramble the order of sixty-four bit subsets of the data packet, and in a second stage the whitening module 512 may scramble the eight bytes within each sixty-four bit subset. In a further embodiment, the whitening module 512 may scramble the eight bits within each byte of a subset during a third stage. The inverse bias module 332, in one embodiment, uses one or more known values or stored indicators to reverse this process and rearrange the data packet in its original source order.

In one embodiment, the bias compression module 514 compresses the data packet to gain an amount of space. The bias compression module 514, in a further embodiment, pads the amount of space gained by the compression with bits of data that bias the data packet toward the bias of the storage cells. The bias compression module 514 may compress the data packet in a similar manner to the compression module 312. In one embodiment, the bias compression module 514 replaces or is part of the compression module 312 and may alter a compression routine to bias data. In one embodiment, the bias compression module 514 may differ from the compression module 312 in that the purpose of the compression by the bias compression module 514 is not to maximize the amount of data that may be stored in the solid-state storage media 110, but to bias the data toward the bias of the storage cells. The data packet that the bias compression module 514 compresses, in one embodiment, has been packetized by the packetizer 302 and is sized for storage in a specific storage region of the solid-state storage media 110 such that space gained by compressing the data packet may not be usable by other data packets.

In one embodiment, the bias compression module 514 biases the data packet by padding the space gained by the compression. For example, the bias compression module 514, in one embodiment, may fill the space gained by the compression with binary ones, binary zeroes, a balance of binary ones and zeroes, or another data pattern that more closely satisfies the bias of the storage cells. In a certain embodiment, the bias compression module 514 may select padding data that causes the data packet or other source data to exactly match a target bias, such as an exact balance of binary ones and binary zeroes, or the like. In other embodiments, it may be undesirable to exactly match a target bias. The bias compression module 514 may pad source data by adding the padding data in a single location within the source data, interleaving or spreading the padding data reversibly through the source data, or otherwise adding the padding data to the source data to bias the source data. As described above, in certain embodiments, the whitening module 512 may pad source data without compressing the source data.

In a further embodiment, the bias compression module 514 pads the space gained by the compression with useful data that biases the data packet toward the bias of the storage cells. For example, in one embodiment, the bias compression module 514 may store bias indicators from the indicator module 518 in the space gained that identify how the bit biasing module 508 has biased the data packet such that the inverse bias module 332 can reverse the operation. In another example, in one embodiment, the bias compression module 514 may store ECC code data in the gained space, in conjunction with or in addition to the ECC data generated by the ECC encoder 304. This may provide more robust error correction than would be available without the compression using ECC data from the ECC encoder 304 alone.

In one embodiment, the relocation module 516 shifts the bits of the data packet within the data packet such that a start position for data and metadata within the data packet changes for each data packet. Shifting bits, in various embodiments, may include relocating the bits, interleaving the bits, rearranging the bits, rotating positions of the bits, or the like. The relocation module 516 shifts the bits according to a reversible algorithm such that the inverse bias module 332 may recover the source data in an original source state. In one embodiment, the relocation module 516 shifts the bits in conjunction with one or more of the flip module 510, the whitening module 512, and the bias compression module 514.

In one embodiment, the relocation module 516 selects a location within the data packet and/or within a storage region of the solid-state storage media 110 for the start position. The relocation module 516 may shift the bits of the data packet within a buffer or other temporary storage, or may cooperate with the write module 506 to write the data packet to the storage region of the solid-state storage media 110 in a shifted order. In one embodiment, the relocation module 516 starts the data and metadata at the starting location and continues the data and metadata to an end of the data packet and/or storage region, wrapping the data and metadata around to a beginning of the data packet and/or storage region.

The relocation module 516, in one embodiment, uses a reversible algorithm to select the starting position such that the inverse bias module 332 may re-shift the bits of the data packet to their original source positions. For example, the relocation module 516, in one embodiment, may derive the starting location from one or more sequence numbers, addresses, or the like. The relocation module 516, in certain embodiments, may pseudo-randomly select a starting location, a shifted order, or the like. In another embodiment, the relocation module 516 may use a fixed offset for the starting location for each data packet throughout the solid-state storage media 110, and may change the offset periodically over time, or the like. The relocation module 516, in one embodiment, may initially use a starting position that is at a beginning of the data packet and/or storage region, and may shift the starting position by a predefined amount, such as one bit, with each successive data packet for the storage region.

In a further embodiment, an indicator, such as an end-of-file ("EOF") symbol or other bit pattern, allows the inverse bias module 332 to locate the starting location. Like the rearranging by the whitening module 512, the shifting by the relocation module 516 reduces wear on storage cells that correspond to locations within the data packet that repeatedly have a bias different than the bias of the storage cells, balancing the wear throughout the storage region. In certain embodiments, the relocation module 516 may reduce inter-cell interference, improve a signal to noise ratio, or the like. In one embodiment, the relocation module 516 may shift bits of source data in conjunction with biasing of the source data by the flip module 510, the whitening module 512, and/or the bias compression module 514. In other embodiments, the relocation module 516 may operate independently, shifting bits of the source data without additional biasing from other modules.

In one embodiment, the indicator module 518 stores an indicator for the data packet to indicate to the inverse bias module 332 that the bias module 318 has biased the bits of the data packet. The indicator module 518 may store the indicator as metadata with the data packet, with other metadata elsewhere in the solid-state storage media 110, or in other storage separate from the solid-state storage media 110. For example, in one embodiment, the indicator module 518 may store the indicator with ECC data from the ECC encoder 304. For example, the indicator module 518 may store a bit or other indicator for each data packet or subset of a data packet, indicating whether the flip module 510 has flipped it. In a further embodiment, the indicator module 518 may store an indicator to indicate an offset or starting location used by the relocation module 516.

As described above, in one embodiment, the bit biasing module 508 uses known data as a seed, nonce, offset, or the like such that the indicator module 518 is not needed. In another embodiment, the indicator module 518 may store a seed, nonce, offset value, or the like to assist the inverse bias module 332 in converting the biased data packet back to its original source state. In one embodiment, the bit biasing module 508 uses one or more of the flip module 510, the whitening module 512, the bias compression module 514, and the relocation module 516 to bias, whiten, scramble, rearrange, or relocate bits of data stored by the indicator module 518 to minimize wear on the storage cells that may be caused by the indicator data.

The bit biasing module 508, in one embodiment, determines which of the flip module 510, the whitening module 512, the bias compression module 514, and the relocation module 516 to use, and which biasing, whitening, scrambling, rearranging, or relocating techniques to employ based on configurable parameters. The configurable parameters may be set by a user, an operating system, a file system, a device driver, a volume manager, or the like. The configurable parameters may be universally applicable to each data packet, or may be apply to a subset of data packets.

In one embodiment, the write module 506 writes the biased data packet to the storage cells of the solid-state storage media 110, either directly or indirectly. For example, in one embodiment, the write module 506 may write the biased data packet to an element in the write data pipeline 106, such as the ECC encoder 304, the write buffer 320, or the like. In a further embodiment, the write module 506 may include, may write to, or may be in communication with a write agent or the like to write the biased data packet to the storage cells of the solid-state storage media 110. The write module 506, in one embodiment, writes the biased data packet to a specific storage region of the solid-state storage media 110.

Figure 5B:
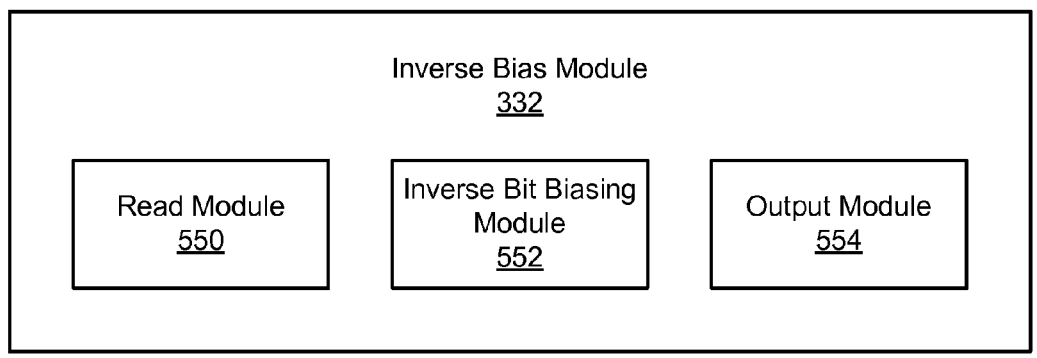
FIG. 5B is a schematic block diagram illustrating one embodiment of an inverse biasing module in accordance with the present invention.

FIG. 5B is a schematic block diagram illustrating one embodiment of the inverse bias module 332 in accordance with the present invention. In the depicted embodiment, the inverse bias module 332 includes a read module 550, an inverse bit biasing module 552, and an output module 554. In general, the inverse bias module 332 reads the biased data packet from the storage cells of the solid-state storage media 110 and converts the bits of the biased data packet back to bit values representative of the source data of the data packet, including a source bias of the data packet.

In one embodiment, the read module 550 reads the biased data packet, either directly or indirectly from the storage cells. For example, in one embodiment, the read module 550 may read or otherwise receive the biased data packet from an element in the read data pipeline 108, such as the ECC decoder 322, the read synchronization buffer 328, or the like. In another embodiment, the read module 550 may include, may read from, or may otherwise be in communication with the read agent 402 or the like to read the biased data packet from the storage cells of the solid-state storage media 110.

In one embodiment, the inverse bit biasing module 552 converts the bits of the biased data packet back to the original source data of the data packet. The inverse bit biasing module 552 may access an indicator or other information stored by the indicator module 518, or may use a known seed, nonce, offset, or the like to convert the biased data packet back to the original source data packet.

In one embodiment, the inverse bit biasing module 552 flips binary values of bits of the biased data packet to undo flipping by the flip module 510. In a further embodiment, the inverse bit biasing module 552 uses a known or stored seed, nonce, or the like to undo encryption, scrambling, or other pseudo-randomization of the data packet by the whitening module 512. The inverse bit biasing module 552, in another embodiment, decompresses the biased data packet that the bias compression module 514 compressed. In a further embodiment, the inverse bit biasing module 552 shifts the bits of the biased data package to undo the shifting of the bits by the relocation module 516.

In one embodiment, the output module 554 sends the data packet of source data from the inverse bit biasing module 552 to a module, buffer, the computer 112, a client 114, or the like. In a further embodiment, the output module 554 sends the data packet to an element in the read data pipeline 108, such as the depacketizer 324, the ECC decoder 322, or the like.

FIG. 6A is a schematic block diagram illustrating one embodiment of an array 600 of N number of storage elements 606 in accordance with the present invention. In the depicted embodiment, an ECC chunk 616 includes data 612 from several storage elements 606. In a further embodiment, ECC checkbits for the ECC chunk 616 are also stored across several storage elements 606.

The array 600 of storage elements 606, in one embodiment, includes N number of storage elements 606a, 606b, 606c, . . . 606n. Each storage element 606 may comprise a device, a chip, a portion of a chip, a die, and the like. In the depicted embodiment, the storage elements 606a-n form a bank 602a. The array 600, in one embodiment, includes several banks 602a . . . 602m. The banks 602a-m, in the depicted embodiment, include several channels 604a, 604b, 604c, 604n. In one embodiment, a packet or data set is written across the several channels 604a-n and data is read separately from each channel 604a-n and reassembled into the packet. In another embodiment, an ECC chunk 616, packet, or data set is written across the several channels 604a-n and data is read in parallel from all the channels 604a-n. One read operation on a bank 602a may read a whole ECC chunk 616, packet, or data set or a portion of an ECC chunk 616, packet, or data set that is reassembled into a whole ECC chunk 616, packet, or data set. In the depicted embodiment, each channel includes at least one storage element 606 in each bank 602.

Furthermore, in one embodiment each storage element 606 includes a physical erase block or "PEB" 608. For example, storage element one 606a includes PEB one 608a. A physical erase block is typically an erase block located on one die, chip, or other storage element 606. Each PEB 608 includes m physical pages 610. For example, PEB one 608a includes page 0 610a ... page m 614a. Each physical page 610a stores a portion of data ("D 0, D 1, ... D m") 612 and ECC checkbits distributed with the data 612.

In one embodiment, a group of PEBs (PEB 1 608a-PEB m 608m) forms a logical erase block ("LEB"). An LEB spans the array of N storage elements 600. Furthermore, in an embodiment, a logical page ("LP") spans a plurality of physical pages 610 in a row. In another embodiment a logical page spans N storage elements 606a-n.

In one embodiment, the ECC is a block code that is distributed with the data. Furthermore, the data and the ECC may not align with any particular physical hardware boundary. As a result, error correction with the ECC codes is not dependent on a particular hardware configuration. Therefore, the ECC and corresponding data may form an ECC chunk 616 and the ECC chunk may be divided and stored on one or more of the N storage elements 606a-n. An ECC chunk 616 typically spans at least a portion of a plurality of physical pages 610 of a logical page where the data and ECC generated from the data 612a, 612b, . . . 612m are spread across the N storage elements 606a-n. In one embodiment, a LP includes a plurality of ECC chunks 616. A physical page 610 may contain one or more data bytes of the ECC chunk 616. An ECC chunk 616 may span multiple rows within a physical page 610 and a physical page 610 may include a plurality of ECC chunks 616.

Because, in the depicted embodiment, the ECC checkbits for the ECC chunk 616 are distributed across several storage elements 606a-n and channels 604a-n, when a data error occurs due to a read voltage shift in one or more of the storage elements 606a-n, the ECC module 412 may not be able to determine which storage elements 606 have an error that is correctable by adjusting the read voltage threshold. In one embodiment, the distribution module 414 determines which storage elements 606 or channels 604 have data with a read bias that is outside an expected distribution of the known bias, and the read voltage module 352 adjusts the read voltage thresholds of the storage elements 606 determined by the distribution module 414.

In one embodiment, the deviation module 404, the ECC module 412, and/or the distribution module 414 determines that a data set has an error or a read bias that deviates from the known bias, and the data set source module 422 determines from which storage element 606 the data set was read. For example, in one embodiment, the array 600 may have 24 channels 604, and 8 bytes may be read in parallel from 24 storage elements 606 of a single bank 602 during a read operation for a total of 192 bytes per read operation. Based on this information, the data set source module 422, in one embodiment, can determine from which storage element 606 a data set was read based on the position of an 8 byte data set within the 192 bytes. In one embodiment, the 192 bytes comprise the ECC chunk 616.

By comparing read biases of data from each of the channels 604a-n to the known bias, the read voltage module 352 can correct data errors that occur due to changes in read voltages for particular channel(s) even without the use of ECC checkbits. Without comparing the read biases of data from the channels 604a-n to the known bias, adjustment of the read voltage thresholds would require a large number of trial-and-error tests adjusting and testing every possible read voltage threshold adjustment for each possible combination of channels 604a-n. By comparing the read biases of data from the channels 604a-n to the known bias, the read voltage module 352 can determine exactly which channel 604 to adjust. By determining the direction of deviation for those channels, the read voltage module 352 further decreases the search space for the read voltage thresholds for those channels by half.

To illustrate the potential size of the search space for a suitable adjusted read voltage threshold, suppose an ECC chunk 616 (i.e. ECC code word—comprising both data and the corresponding ECC checkbits) is stored on the storage elements 606a-606n. Further suppose that the storage elements 606a-606n in a row of the array 600 that stores the ECC chunk 616 each have an independent adjustable read voltage threshold. For example, in one embodiment, the number of different combinations of read voltage threshold settings for the array 600 with η channels 604a-n, λ number of levels at which the read voltage threshold can be set per channel, and x number of channels that have a read voltage threshold that needs to be adjusted is given by equation 1:

$$f(x,\eta,\lambda) = \binom{\eta}{x} \cdot \lambda^x \quad (1)$$

The number of different combinations of read voltage threshold settings for the array 600 with all permutations of up to η channels 604a-n, in one embodiment is given by equation 2:

$$g(x,\eta,\lambda) = \Sigma_i^{x=1} f(i,\eta,\lambda) \quad (2)$$

Using equation 1, for example, if there are twenty-four channels 606a-n (η=24), eight possible read voltage threshold settings for each channel 606 (λ=8), and only two of the twenty-four channels 606a-n have read voltage thresholds that need to be adjusted (x=2), there are 17,644 total different combinations of read voltage threshold settings. If the number of channels 606 with read voltage thresholds that need adjusting increases to three, the number of different combinations increases to 1,036,288. The read voltage module 352 drastically reduces these numbers by detecting which channels 606a-n have read voltage thresholds that need adjusting. In addition, comparing the known bias of the data on the media in a storage grouping to the current bias indicates the direction to adjust the read voltage thresholds. Knowing the direction in which to adjust the read voltage threshold greatly reduces the search space for a suitable voltage in the channels known to have a data error.

Consequently, the number of combinations that may need to be attempted changes from 17,644 where x=2 to 32 and from 1,036,288 where x=3 to 256, because the read voltage module 352 uses the known bias to determine which channels have read voltage thresholds that need adjusting and the direction of the adjustment. However, each of these combinations may not need to be tried because as the adjustments are iteratively made, the known bias of the data continues to indicate which direction to make each subsequent adjustment, potentially cutting the search space at least in half with each iteration. Various search algorithms can be used to quickly identify a suitable adjusted read voltage threshold, (i.e. a binary search).

FIG. 6B is a schematic block diagram illustrating one embodiment of an array 650 of N storage elements 606 in accordance with the present invention. The array 650, in the depicted embodiment, is substantially similar to the array 600 of FIG. 6A, but with the ECC chunk 652 including data 612a in a single storage element 606a, instead of across several storage elements 606a-n. In one embodiment, ECC checkbits for the ECC chunk 652 are stored in the single storage element 606a. Because each storage element 606a-n or channel 604a-n has separate ECC checkbits, in one embodiment, the ECC module 412 uses the separate ECC checkbits to determine in which storage elements 606a-n or channels 604a-n an error has occurred, and the read voltage module 352 adjusts the read voltage thresholds of the particular storage element(s) 606 determined by the ECC module 412.

Figure 6C:
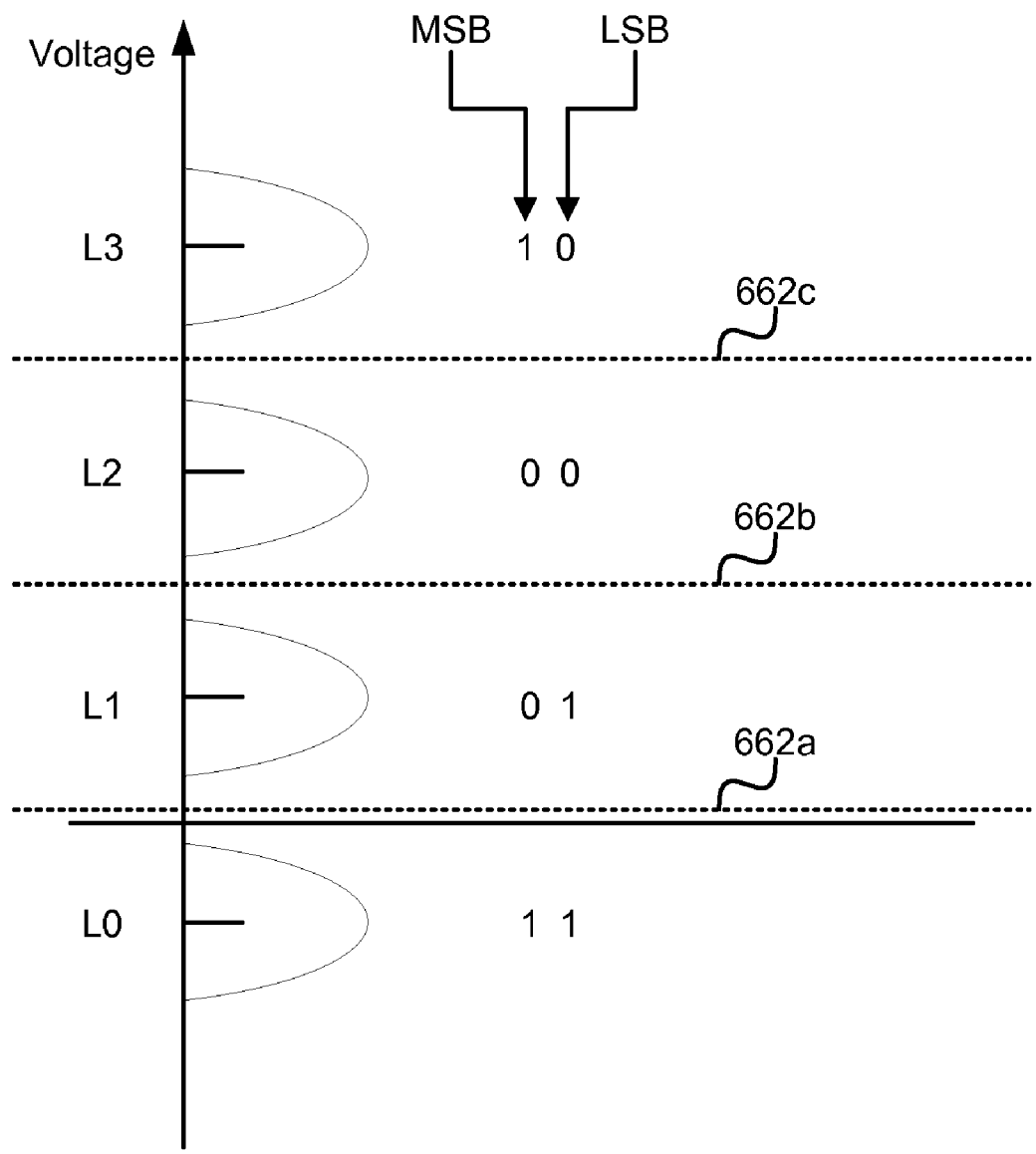
FIG. 6C is a schematic block diagram illustrating one embodiment of an encoding model for a multi-level storage cell of solid-state storage media in accordance with the present invention.

FIG. 6C shows one embodiment of an encoding or programming model for a multi-level storage cell, such as MLC NAND flash storage cells, or the like. Any limitations inherent in the represented encoding model do not necessarily apply to all other encoding models, and the present invention should not be construed as inherently containing any such limitations. The read voltage states, in the depicted embodiment, are encoded using a Gray code encoding model, with binary values for adjacent states differing by a single bit in the encoding.

FIG. 6C shows that the value "11" is associated with the lowest read voltage state (labeled L0), the value "01" is associated with the next lowest read voltage state, the value "00" is associated with the next highest read voltage state, and the value "10" is associated with the highest read voltage state (labeled L3). In FIG. 6C, the lowest read voltage state L0 is depicted as a negative voltage. Values, magnitudes, sizes, and the like of read voltages may vary by manufacturer and type of solid-state storage cell, each of which are encompassed by the present invention. Read voltage thresholds 662 separate states L0, L1, L2, and L3, as described above. The solid-state storage controller 104 interprets the four discrete levels of voltage stored in the multi-level storage cell as representing two binary bits one represented by a most significant bit (MSB) in the cell encoding and one represented by a least significant bit (LSB) in the cell encoding. As explained above, other programming and encoding models may be used. Also, certain solid-state storage media 110 may have more than four possible states, allowing more than two binary values to be stored in a single multi-level storage cell. The voltage levels L0, L1, L2, and L3 may or may not be contiguous; for example, in certain embodiments, the voltage levels are separated by band gaps known as guard band. For example, L0 and L1 may be separated by 0.3V.

In one embodiment, the LSB corresponds to a lower page of data and the MSB corresponds to an upper page of data. In certain embodiments, the multi-level storage cell may adhere to a two-phase programming model, described below, which requires that the LSB be written to before the MSB can be written or vice versa. In another embodiment, the LSB and MSB may be programmed separately by the solid-state storage controller 104. Such an approach may be taken due to vendor or manufacturer requirements for page pairing (i.e., a LSB bit of MLC cell is paired with an MSB bit of a different MLC cell) and page addressing (i.e., LSB page must be programmed before the MSB page or vice versa). In certain instances, the LSB must be written before the MSB is written, the MSB must be written before the LSB is written, or the like.

In certain embodiments, the solid-state storage media 110 may employ a two-phase programming model. In such a model, a binary value is first written to the LSB by way of a first write command to the lower page. The write command causes the multi-level storage cell to move from its initial state (for example, all state in L0) to an intermediate state (the lower-to-middle LM state—between L1 and L2) configured such that a 00 state is subsequently read. For example, writing a "0" to the lower page causes the multi-level storage cell to change from the L0 state (where both the LSB and the MSB are 1) to the L2 state (where the LSB is changed to a 0). A subsequent write of a "0" to the upper page moves the multi-level storage cell from the intermediate state (typically between the L1 state and the L2 state) to L2 state such that both bits of the MLC are "0". Thus, in such an embodiment, two writes (one to the lower page and one to the upper page) are needed to move the multi-level cell from L0 to L2, since the cell transitions through the intermediate state and the MLC device requires that the lower page be programmed before the upper page and does not allow partial programming of a page without an intervening erase operation. Writing a "1" to either of the upper page or lower page will cause the MLC to transition to either L1 or L3 depending on the binary value of the lower page at the time. In addition, certain solid-state media vendors may impose a requirement that the lower page must be written to before the upper page, or the like. In other embodiments, the solid-state storage media 110 may employ a two-phase programming model where a binary value is first written to the MSB by way of a first write command to the upper page.

In one embodiment, the read voltage module 352 adjusts one or more read voltage thresholds 662 based on a subset of binary data that multi-level storage cells store, such as just an upper page, just a lower page, or the like. In such embodiments, examining the state changes for the LSB bit(s) indicate the direction the voltage in the multi-level storage cell is changing. For both Gray code encoding (as depicted in FIG. 6C) and binary code encoding of bit values, the LSB of a multi-level storage cell transitions between a binary zero and a binary one between the middle two abodes or states, the L1 state and the L2 state in the depicted embodiment. For other encoding models, the MSB may transition between a binary zero and a binary one between the middle two abodes or states, or the like. For Gray code or binary code encoding models, the LSB has a value of "1" for read voltages in a lower range (including the lower two states or abodes, L0 and L1) and the LSB has a value of "0" for read voltages in an upper range (including the upper two states or abodes, L2 and L3). By using just the LSB of MLC storage cells to determine whether a read bias deviates from a known bias, the read voltage module 352, in one embodiment, may make the determination in a substantially similar manner to determining whether a read bias for SLC storage cells deviates from a known bias, by counting or tallying binary ones and/or binary zeroes of an LSB data set, or the like.

For certain types of multi-level storage cells, the middle read voltage threshold 662b and the adjacent L1 and L2 states may be more sensitive to read disturb or other factors that can cause read voltages to drift. Further, as described above, in certain embodiments, the LSB and the MSB of a single multi-level storage cell may represent data stored in different physical pages. Using a single bit from each of a plurality of multi-level storage cell as a data set, in one embodiment, may reduce a number of read operations to retrieve the data set. In other embodiments, use of a single bit from each of a plurality of multi-level storage cells in the lower page simplifies a process of detecting a deviation and direction of a read bias from a known bias for multi-level storage cells.

In one embodiment, the direction module 406 determines a direction of deviation for a grouping of multi-level storage cells based on a data set that includes data from one or more lower pages of the multi-level storage cells. Because the lower pages include the LSBs, in certain embodiments, the direction module 406 determines that a read voltage threshold 662 deviates toward a larger read voltage in response to a difference between a read bias for the lower pages and a known bias for the lower pages indicating that storage cell values for the LSBs have transitioned from a binary one to a binary zero. For an LSB to transition from a binary one to a binary zero, a read voltage for a multi-level storage cell using the encoding model of FIG. 6C must drift from either an L0 or L1 state to an L2 or L3 state, indicating that one or more of the read voltage thresholds 662 should be increased, to place the read voltage back in the original L0 or L1 state.

Similarly, in certain embodiments, the direction module 406 determines that a read voltage threshold 662 deviates toward a smaller read voltage in response to a difference between a read bias for the lower pages and a known bias for the lower pages indicating that storage cell values for the LSBs have transitioned from a binary zero to a binary one. For an LSB to transition from a binary zero to a binary one, a read voltage for a multi-level storage cell using the encoding model of FIG. 6C must drift from either an L3 or L2 state to an L1 or L0 state, indicating that one or more of the read voltage thresholds 662 should be decreased, to place the read voltage back in the original L3 or L2 state. In certain embodiments, a deviation across multiple states may be unlikely, and deviations detectable using LSBs may be between the L1 and L2 states, indicating a clear direction of deviation in either direction.

In another embodiment, the direction module 406 determines a direction of deviation based at least partially on an encoding type used for storage cells of the solid-state storage media 110, a physical and/or electrical architecture of the storage cells of the storage media 110, or the like. For example, based on the encoding model of FIG. 6C, the direction module 406 may determine a direction of deviation based on a 2-bit MLC storage media type, based on whether the data set includes an upper page or a lower page, based on the depicted Gray code encoding type, based on a magnitude of the determined deviation, or the like. In a further embodiment, the direction module 406 may transform or combine LSBs and MSBs from separate or disparate addresses, such as different physical pages or the like, into a single data set or may otherwise coordinate LSBs and MSBs to determine a direction of deviation.

Using each bit stored in multi-level storage cells to determine a read voltage threshold adjustment, in certain embodiments, can increase the accuracy of the read voltage threshold adjustment, but may increase the number of read operations or add complexity to the determination. In one embodiment, if the ECC decoder 322 detects a data error in an upper page of a grouping of multi-level storage cells, the data set read module 402 retrieves one or more lower pages for the grouping and the read voltage module 352 adjusts a read voltage threshold for the grouping based on the lower pages.

Flow Chart

Figure 7:
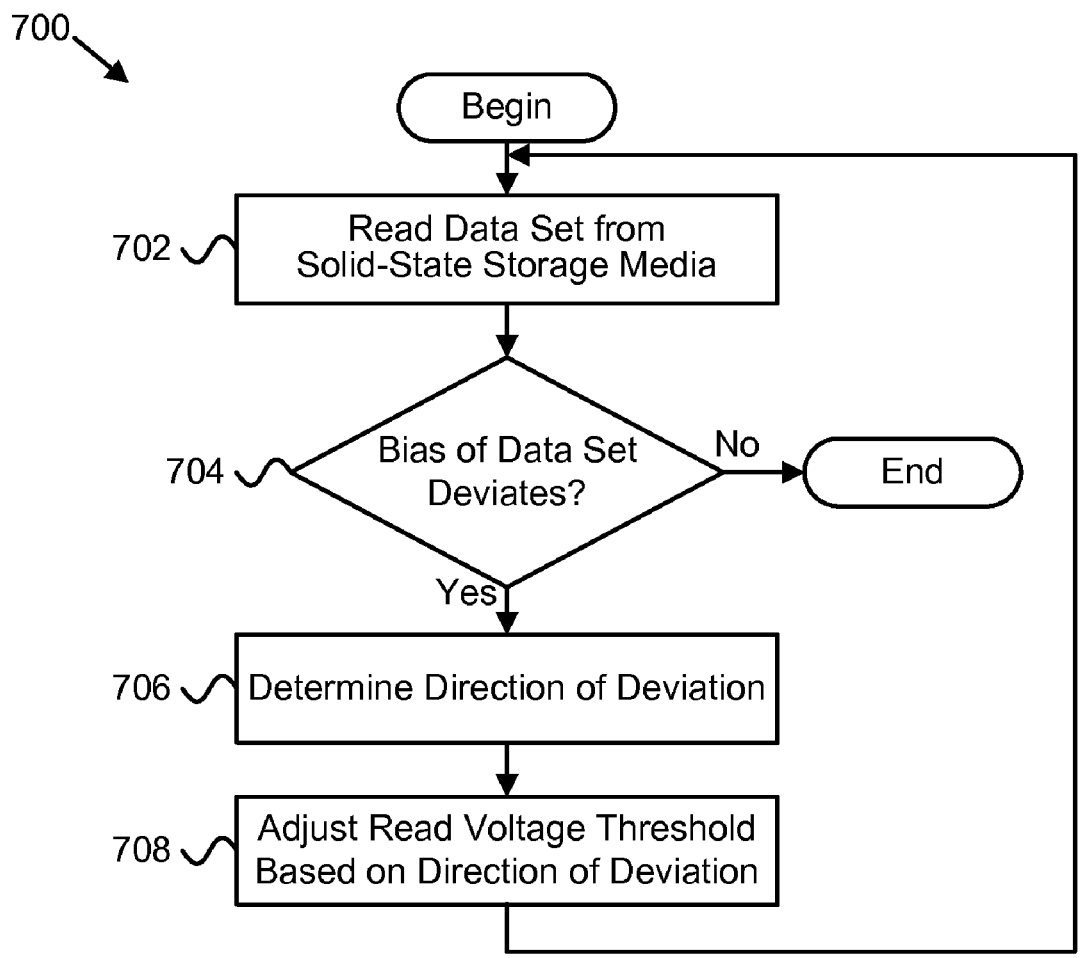
FIG. 7 is a schematic flow chart diagram illustrating one embodiment of a method for determining a read voltage threshold for solid-state storage media in accordance with the present invention.

FIG. 7 is a schematic flow chart diagram illustrating one embodiment of a method 700 for determining a read voltage threshold for the solid-state storage media 110 in accordance with the present invention. The data set read module 402 reads 702 a data set from the solid-state storage media 110. The deviation module 404 determines 704 that a read bias for the data set deviates from a known bias with which the data set was originally stored. If the deviation module 404 (and/or the distribution module 414) determines 704 that the read bias of the data set does not deviate from the known bias, or falls within an expected distribution of the known bias, the method 700 ends. In a further embodiment, the method 700 may end in response to the ECC module 412 determining that the ECC decoder 322 can correct the data error.

If the deviation module 404 determines 704 that the read bias of the data set deviates from the known bias, the direction module 406 determines 706 a direction of deviation for the data set. As described above, the direction of deviation is based on a difference between the read bias of the data set and the known bias. The adjustment module 408 adjusts 708 the read voltage threshold of storage cells associated with the data set based on the direction of deviation. The data set read module 402, in certain embodiments, re-reads 702 the data set using the adjusted read voltage threshold and the method 700 continues until the deviation module 404 (and/or the distribution module 414) determines 704 that the read bias of the re-read data set does not deviate from the known bias and the method 700 ends. In a further embodiment, the method 700 continues until the ECC module 412 determines that the ECC decoder 322 can correct the data error.

Figure 8:
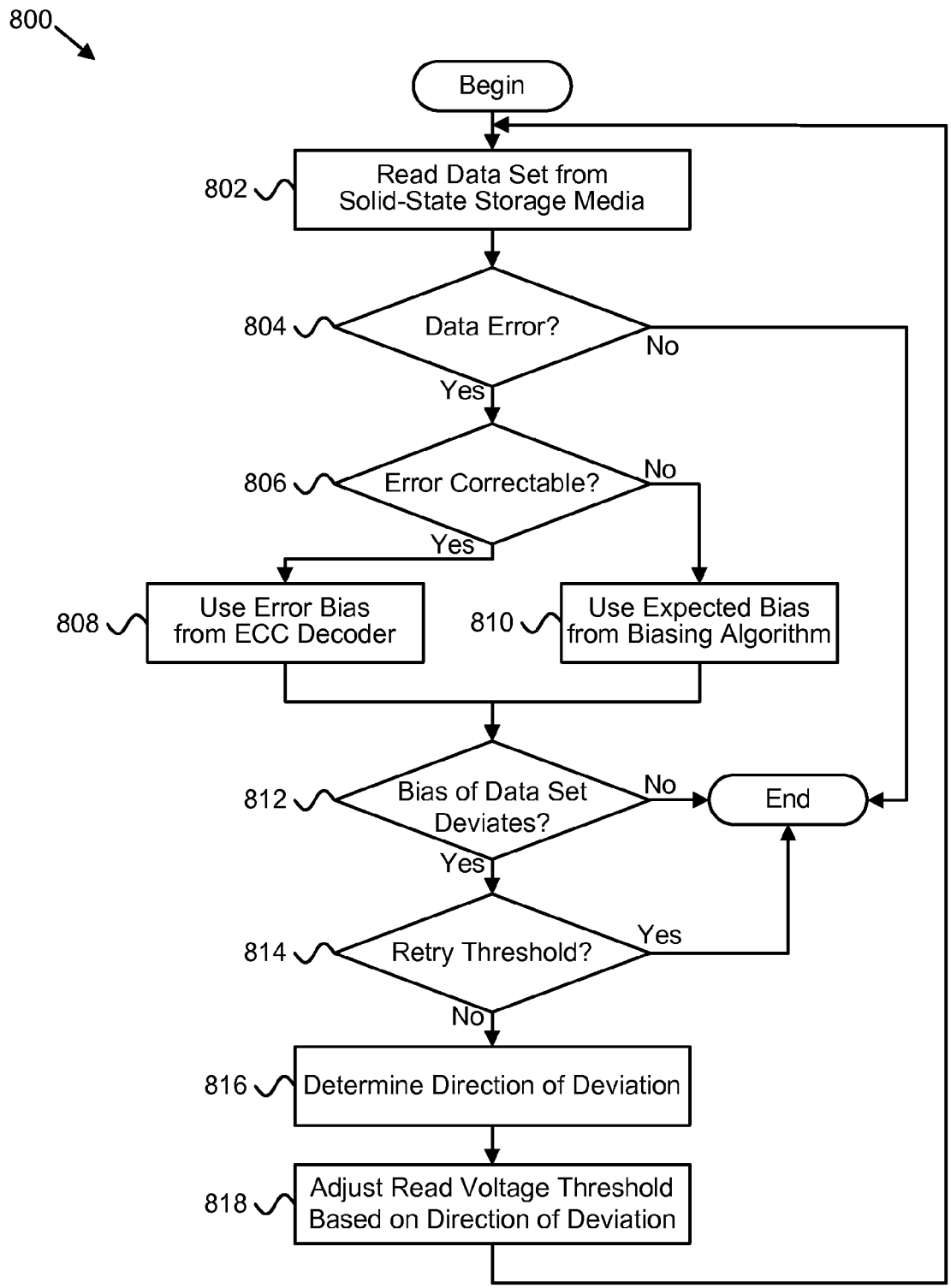
FIG. 8 is a schematic flow chart diagram illustrating another embodiment of a method for determining a read voltage threshold for solid-state storage media in accordance with the present invention.

FIG. 8 is a schematic flow chart diagram illustrating another embodiment of a method 800 for determining a read voltage threshold for solid-state storage media 110 in accordance with the present invention. The method 800, in one embodiment, may begin in response to the read error module 420 determining that a data error has occurred. In a further embodiment, the monitor module 418 initiates the method 800 with each read request, at regular intervals, or the like, regardless of whether a data error has occurred. The data set read module 402 reads 802 a data set from the solid-state storage media 110. The data set, in one embodiment, may include one or more packets or portions of a packet that have been requested by a client, in which a data error has occurred, or the like. In one embodiment, the data set read module 402 may read 802 data sets from several different channels 604a-n, and the read voltage module 352 may perform the method 800 for each channel 604a-n, or for channels 604 identified by the ECC module 412 and/or the distribution module 414.

The ECC decoder 322, in the depicted embodiment, determines 804 whether or not there are one or more data errors in the data set. If the ECC decoder 322 determines 804 that the data set has no data errors, the method 800 ends. If the ECC decoder 322 determines 804 that the data set has one or more data errors, the ECC decoder 322 determines 806 whether or not the one or more data errors are correctable by the ECC decoder 322. If the ECC decoder 322 determines 806 that the one or more data errors are correctable by the ECC decoder 322, the read voltage module 352 uses 808 a known bias and an error bias from the ECC decoder 322 in the determining steps 812, 816 described below. If the ECC decoder 322 determines 806 that the one or more data errors are uncorrectable by the ECC decoder 322, the read voltage module 352 uses 810 a known, expected bias and a read bias for the data set from the inverse bias module 332 or the like, in the determining steps 812, 816 described below. In other embodiments, as described above with regard to FIG. 3B, the read voltage module 352 may use bias data from both the inverse bias module 332 and the ECC decoder 322, statistics from the device factor module 354, or the like to determine a read voltage threshold adjustment.

The deviation module 404 determines 812 whether or not a read bias for the data set deviates from a known bias with which the data set was originally stored. If the deviation module 404 (and/or the distribution module 414) determines 812 that the read bias of the data set does not deviate from the known bias, falls within an expected distribution of the known bias, or the like, the method 800 ends. In the depicted embodiment, if the deviation module 404 determines 812 that the read bias of the data set deviates from the known bias, the adjustment module 408 determines 814 whether or not a retry threshold for re-reading 802 the data set from the solid-state storage media 110 has been satisfied. If the adjustment module 408 determines 814 that the retry threshold is satisfied, the method 800 ends.

If the adjustment module 408 determines 814 that the retry threshold has not been satisfied, the direction module 406 determines 816 a direction of deviation for the data set. As described above, the direction of deviation is based on and may include a difference between the read bias of the data set and the known bias. The adjustment module 408 adjusts 818 the read voltage threshold of storage cells associated with the data set based on the direction of deviation. In the depicted embodiment, the data set read module 402 re-reads 802 the data set using the adjusted read voltage threshold and the method 800 continues until the deviation module 404 (and/or the distribution module 414) determines 812 that the read bias of the re-read data set does not deviate from the known bias or the adjustment module 408 determines 814 that the retry threshold is satisfied and the method 800 ends.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to determine a direction to adjust a read voltage threshold for solid-state storage media, the method comprising:
   reading a data set from storage cells of solid-state storage media, the data set originally stored in the storage cells with a known bias;
   determining that a read bias for the data set deviates from the known bias; and
   determining a direction of deviation for the data set based on a difference between the read bias and the known bias.

2. The method of Claim 1, further comprising adjusting a read voltage threshold for the storage cells of the solid-state storage media based on the direction of deviation.

3. The method of Claim 2, wherein the read voltage threshold is adjusted in the direction of deviation.

4. The method of Claim 2, wherein adjusting the read voltage threshold for the storage cells of the solid-state storage media is based at least partially on one or more statistics for a solid-state storage device of the solid-state storage media.

5. The method of Claim 4, wherein at least one of the one or more statistics is selected from the group consisting of a temperature for the solid-state storage device, an error rate for the solid-state storage device, an erase cycle count for the solid-state storage device, and a storage request latency for the solid-state storage device.

6. The method of Claim 1, wherein the known bias comprises an expected bias for data stored by the solid-state storage media based on a reversible biasing algorithm applied to data written to the solid-state storage media.

7. The method of Claim 1, wherein the known bias comprises an error corrected state of bits of the data set and the read bias comprises an error bias indicating one or more bits of the data set that are in error.

8. The method of Claim 7, further comprising receiving the known bias and the error bias for the data set from an error correction code ("ECC") decoder, the ECC decoder changing the one or more bits that are in error to the error corrected state.

9. The method of Claim 1, wherein determining that the read bias for the data set deviates from the known bias and determining the direction of deviation are performed in response to detecting an uncorrectable data error in the data set.

10. The method of Claim 1, wherein the known bias comprises a known ratio of binary ones and binary zeroes.

11. The method of Claim 10, wherein the known ratio is greater than zero and less than one such that the direction of deviation in either direction of the known ratio is detectable.

12. The method of Claim 10, wherein the known ratio is offset between a ratio of exclusively binary ones and a ratio of exclusively binary zeroes such that the direction of deviation may occur in either direction from the known ratio.

13. The method of Claim 1, wherein the data set comprises a sample data set read in response to a testing operation.

14. The method of Claim 1, wherein the data set comprises a requested data set read in response to a read request from a client.

15. The method of Claim 14, wherein the data set comprises the requested data set and further comprises an amount of additional data read from the solid-state storage media with the requested data set, the amount of additional data sized to fit within excess read bandwidth of the solid-state storage media such that reading the amount of additional data does not affect a read bandwidth for retrieving the requested data set from the solid-state storage media.

16. The method of Claim 1, further comprising determining that the data set was read from a specific grouping of storage cells based on a position of the data set within a sequence of data sets, the solid-state storage media comprising a plurality of groupings of storage cells, data from each grouping of storage cells read during a read operation.

17. The method of Claim 16, wherein each grouping of storage cells comprises a solid-state storage media die.

18. The method of Claim 16, wherein data from each grouping of storage cells is read in parallel during the read operation.

19. The method of Claim 1, wherein the storage cells comprise multi-level storage cells and the data set comprises a subset of binary data that the multi-level storage cells store.

20. The method of Claim 19, wherein the subset of binary data is read from a lower page of the multi-level storage cells, each multi-level storage cell having a plurality of states encoded according to an encoding model such that each state represents two or more bits of the multi-level storage cell having one of two different binary values.

21. The method of Claim 20, wherein determining a direction of deviation for the data set comprises determining that the direction of deviation is toward a larger read voltage in response to the difference between the read bias and the known bias indicating that one or more storage cell values have transitioned from a binary one to a binary zero.

22. The method of Claim 20, wherein determining a direction of deviation for the data set comprises determining that the direction of deviation is toward a smaller read voltage in response to the difference between the read bias and the known bias indicating that one or more storage cell values have transitioned from a binary zero to a binary one.

23. An apparatus for determining a read voltage threshold for solid-state storage media, the apparatus comprising:
   a data set read module that reads a data set from storage cells of solid-state storage media, the data set originally stored in the storage cells with a known bias;
   a deviation module that determines that a read bias for the data set deviates from the known bias;
   a direction module that determines a direction of deviation for the data set, the direction of deviation comprising a difference between the read bias and the known bias; and
   an adjustment module that adjusts a read voltage threshold for the storage cells of the solid-state storage media based on the direction of deviation.

24. The apparatus of Claim 23, further comprising an ECC decoder that provides the known bias and the read bias to the deviation module, wherein the known bias comprises an error corrected state of bits of the data set and the read bias comprises an error bias indicating one or more bits of the data set that are in error.

25. The apparatus of Claim 23, further comprising an inverse bias module that provides the known bias and the read bias to the deviation module, wherein the known bias comprises an expected bias for data stored by the solid-state storage media based on a reversible biasing algorithm applied to data written to the solid-state storage media.

26. The apparatus of Claim 23, further comprising a device factor module that provides, to the adjustment module, one or more statistics for a solid-state storage device of the solid-state storage media, wherein the adjustment module adjusts the read voltage threshold for the storage cells of the solid-state storage media at least partially based on the one or more statistics for the solid-state storage device.

27. A system for determining a direction to adjust a read voltage threshold for solid-state storage media, the system comprising:
   a solid-state storage device comprising solid-state storage media;
   a storage controller for the solid-state storage device, the storage controller comprising,
      a data set read module that reads a data set from storage cells of the solid-state storage media, the data set originally stored in the storage cells with a known bias;
      a deviation module that determines that a read bias for the data set deviates from the known bias;
      a direction module that determines a direction of deviation for the data set, the direction of deviation comprising a difference between the read bias and the known bias; and
      an adjustment module that adjusts a read voltage threshold for the storage cells of the solid-state storage media based on the direction of deviation.

28. The system of Claim 27, wherein the deviation module uses an error bias as the known bias in response to the one or more correctable errors in the data set and the deviation module uses an expected bias as the known bias in response to one or more uncorrectable errors in the data set, the error bias indicating one or more bits of the data set that are in error and the expected bias based on a reversible biasing algorithm applied to data written to the solid-state storage media.

* * * * *